(12) United States Patent
Morales

(10) Patent No.: US 6,810,104 B2
(45) Date of Patent: Oct. 26, 2004

(54) X-RAY MASK AND METHOD FOR MAKING

(75) Inventor: Alfredo M. Morales, Livermore, CA (US)

(73) Assignee: Sandia National Laboratories, Livermore, CA (US)

(*) Notice: Subject to any disclaimer, the term of this patent is extended or adjusted under 35 U.S.C. 154(b) by 8 days.

(21) Appl. No.: 10/146,391

(22) Filed: May 14, 2002

(65) Prior Publication Data

US 2004/0146139 A1 Jul. 29, 2004

(51) Int. Cl.[7] .............................. G21K 5/00
(52) U.S. Cl. ........................................ 378/35
(58) Field of Search ............................ 378/34, 35

(56) References Cited

U.S. PATENT DOCUMENTS

| | | | | |
|---|---|---|---|---|
| 4,035,522 A | * | 7/1977 | Hatzakis ............... | 430/5 |
| 4,436,797 A | * | 3/1984 | Brady et al. .......... | 430/5 |
| 5,234,780 A | * | 8/1993 | Nitayama et al. ..... | 430/5 |
| 5,459,001 A | * | 10/1995 | Estes et al. .......... | 430/5 |
| 5,700,603 A | * | 12/1997 | Lee ..................... | 430/5 |
| 5,770,335 A | * | 6/1998 | Miyake et al. ........ | 430/5 |
| 6,477,225 B1 | * | 11/2002 | Morales et al. ....... | 378/35 |

* cited by examiner

Primary Examiner—Dung T. Nguyen
Assistant Examiner—Richard H Kim
(74) Attorney, Agent, or Firm—Timothy P. Evans

(57) ABSTRACT

The present invention describes a method for fabricating an x-ray mask tool which is a contact lithographic mask which can provide an x-ray exposure dose which is adjustable from point-to-point. The tool is useful in the preparation of LIGA plating molds made from PMMA, or similar materials. In particular the tool is useful for providing an ability to apply a graded, or "stepped" x-ray exposure dose across a photosensitive substrate. By controlling the x-ray radiation dose from point-to-point, it is possible to control the development process for removing exposed portions of the substrate; adjusting it such that each of these portions develops at a more or less uniformly rate regardless of feature size or feature density distribution.

11 Claims, 17 Drawing Sheets

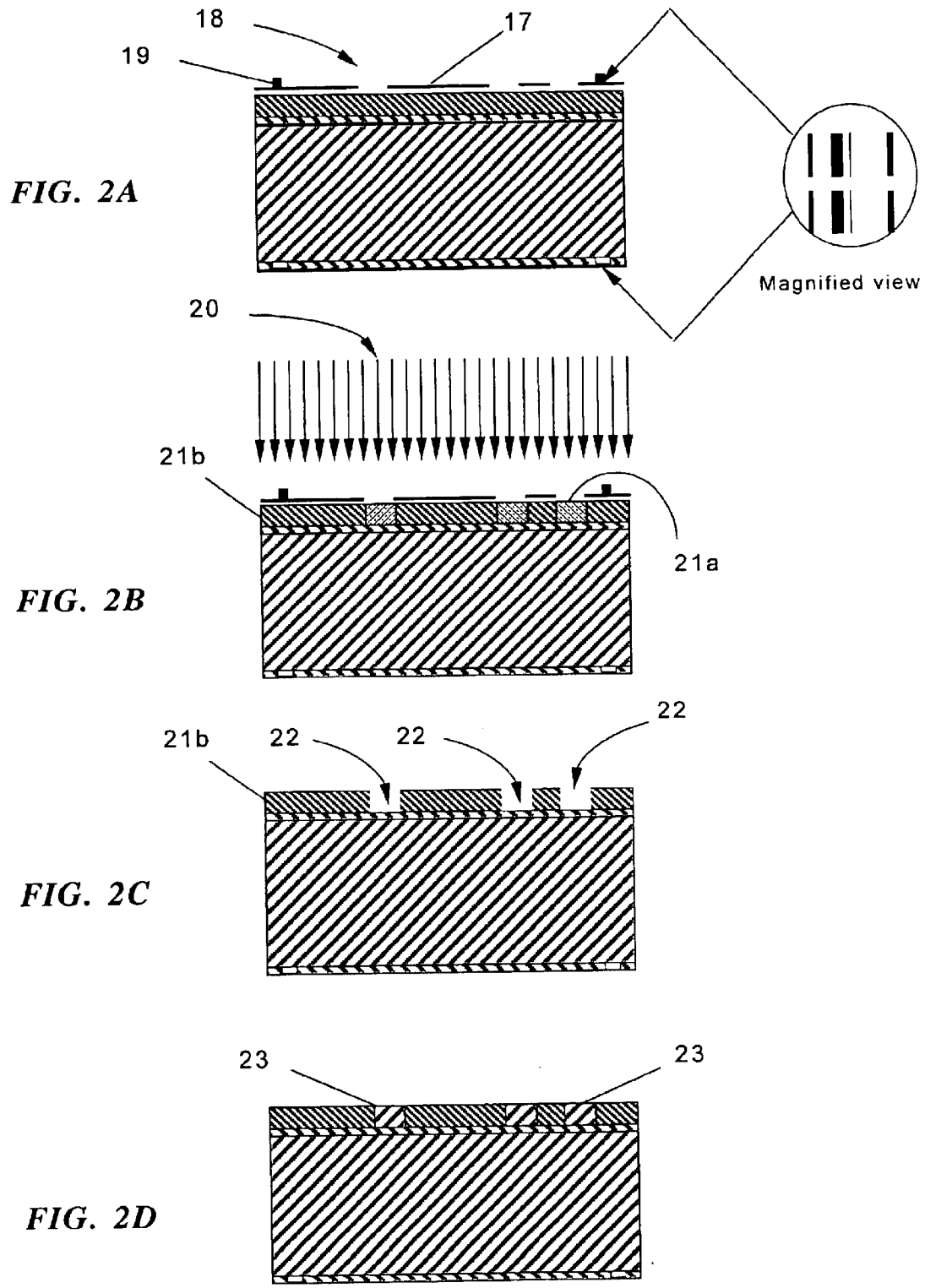

$D_0 > D_1 > D_2 > D_3$

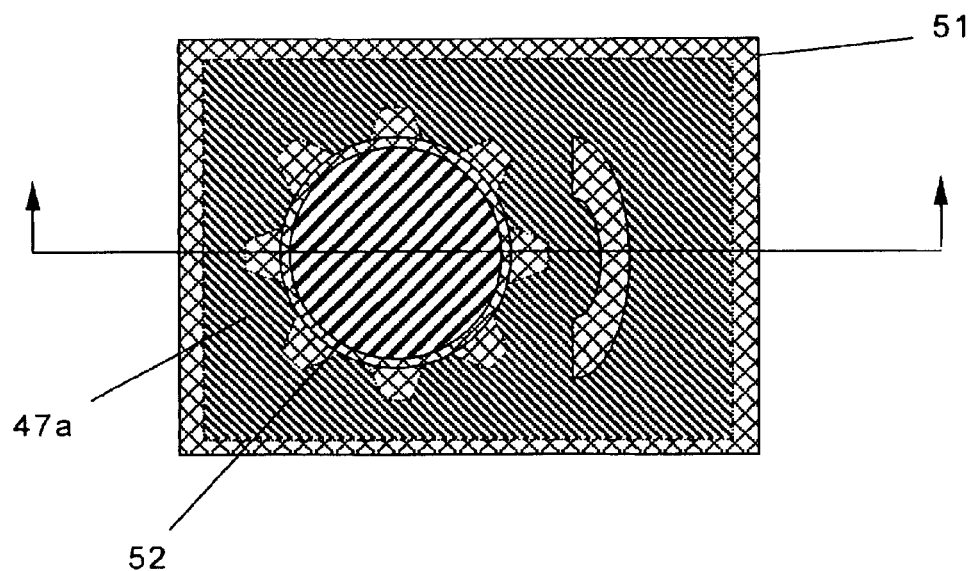
FIG 11D
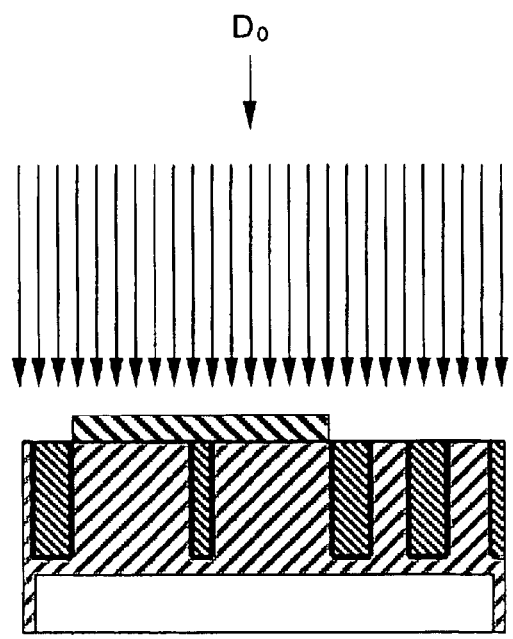
FIG 12
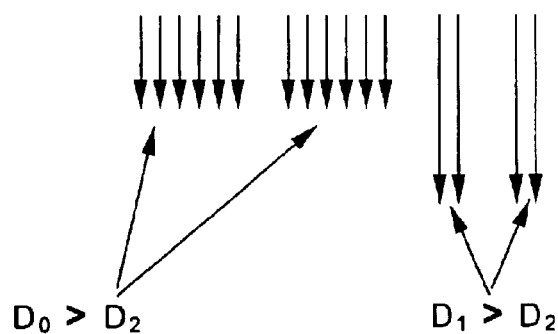

X-RAY MASK AND METHOD FOR MAKING

STATEMENT OF GOVERNMENT INTEREST

The United States Government has rights in this invention pursuant to Contract No. DE-AC04-94AL85000 between the United States Department of Energy and Sandia Corporation, for the operation of the Sandia National Laboratories.

BACKGROUND OF THE INVENTION

1. Field of the Invention

The present invention relates generally to multilevel lithographic contact masks and to a method for producing such masks. The tool is useful in the preparation of LIGA plating molds made from PMMA, or similar materials. In particular the tool is useful for providing an ability to apply a graded, variable exposure dose across a photosensitive substrate. By controlling the exposure dose from point-to-point, it is possible to control the development process for removing exposed portions of the substrate; adjusting it so as to proceed more or less uniformly regardless of feature size or feature density.

2. Background

Preparing microparts by the well known "LIGA" process (LIGA is an acronym based on the first letters for the German words for lithography and electroplating. A general review of the LIGA process is given in the article by W. Ehrfeld, et al., "LIGA Process: Sensor Construction Techniques Via X-Ray Lithography," Technical Digest IEEE Solid State Sensor and Actuator Workshop, 1988, pp. 14–4.) requires producing intricate molds onto which the desired parts may be built-up, typically by plating or a similar deposition process. A variety of methods are known for making microparts such as are described in the patent literature. In particular, U.S. Pat. Ser. Nos. 5,162,078, 5,378,583, 5,527,646, 5,631,514, 5,679,502, and 5,917,260, describe methods and techniques for forming microparts using x-ray radiation as a light source for creating molds for said parts. Most current techniques rely in some manner on using a photosensitive plastic mold fabricated from a material such a PMMA. These molds are typically patterned by illuminating the substrate with a high energy synchrotron beam partially blocked by a radiation-opaque mask. Those areas of the substrate which are lit by the beam experience radiation damage which "cuts" the polymer chains comprising the substance of the substrate to some effected depth. This damaged material is rendered vulnerable to chemical attack and can therefore be "developed" or dissolved away to provide an etched image in the substrate material. However, as more intricate molds are prepared, wherein ever smaller and more closely packed mold features are incorporated into the replicated pattern, mass transport limitations considerably slow the development process in areas which are restricted by lateral size and/or depth. These confined spaces make it difficult for fresh developer to get into and out of these narrow areas resulting in a potential underdevelopment for a given processing time. This limitation begins to create severe problems when developing mold patterns which include features having widely varying packing densities.

In particular, it is known that chemical dissolution kinetics of PMMA are greatly enhanced by the damage induced in those areas exposed to a flux of x-ray radiation thus making it possible to utilize PMMA as a lithographic medium. It is also known that given sufficient time the developer will attack even the unexposed portions of the PMMA. Suppose now that a PMMA mold is prepared to provide a micro-gear that includes a central post to form a central mounting hole in the micro-gear. Such an example is shown, in cross-section, in FIG. 18A Furthermore, suppose that in the same mold a narrow slot is provided for the fabrication of a pusher rod or arm. In this example, material is rapidly removed in the volume of the substrate corresponding to the micro-gear body due to its large relative size, while the material of the adjacent narrow slot reacts much more slowly. However, as shown in FIG. 18B, if one were to wait until the narrow slot is fully developed, the unexposed portion (post) at the center of the micro-gear mold depression, corresponding to the shaft of the micro-gear, is observed to become severely undercut due to its prolonged exposure to the developer solution. Furthermore, if one waits only until the volume of material around the post at the center of the mold is removed, a substantial volume of the exposed PMMA body comprising the narrow slot remains undeveloped (FIG. 18C).

However, by adjusting the radiation dose in various regions of the mold, such that larger, low aspect regions are underexposed while the narrow, high aspect regions are fully exposed, FIG. 19A, it should be possible to develop both regions simultaneously as shown in FIG. 19B.

SUMMARY OF THE INVENTION

In general, therefore, in cases where features are locally isolated, i.e., features which have relatively large volumes of material to be removed around them, the developer reaction acts quickly due to the ability of the developer solution to easily migrate to the reacting surfaces of these areas of the mold. However, those areas having numerous closely packed features, or which exhibit a few features which are relatively small and surrounded by narrow channels, the developer reaction proceeds much more slowly. This difference in the rates of development, therefore, presents a technical challenge needing to be overcome in order to produce molds for making a wide range of micropart-s having widely varying feature sizes.

The prior art does not discuss the problem of simultaneously developing an exposed photosensitive substrate having both closely packed small features and widely separated larger features, nor does it address the advantage of a system for applying a stepped or graded exposure dose to the substrate in order to control the degree of exposure dosing and thus the rate at which different areas of a substrate developed. What is needed, therefore, is a method, and a tool for practicing the method for simultaneously providing different radiation dosing to a plurality of regions on the substrate mold. What is needed is a mul-tizone mask wherein each zone is tailored to pass a specific quantity (dose) of radiation and thus allow for developing a mold at a uniform rate regardless of feature location, configuration, or packing density.

It is, therefore, an object of the present invention to provide a lithographic mask tool for providing a variable range of radiation dosing across the entire useful surface of the mask.

It is another object to provide an x-ray mask comprising a silicon substrate having a metal pattern deposited into one or both surfaces of the substrate wherein the metal pattern is present in one or more thickness.

Yet another object of the invention is to provide a mask having an image forming pattern, wherein the pattern exhibits a range of thicknesses providing varying degrees of radiation attenuation from point to point across the mask surface.

It is another object of the invention to provide an x-ray mask wherein the metal pattern comprises a plurality of structural elements on both faces of the mask substrate.

Still another object of the invention is to provide an x-ray mask wherein the structural elements comprising the pattern cover varying portions of the substrate surface and are also embedded into trenches etched into the substrate surface.

Still another object of the invention is to provide an x-ray mask comprising two or more overlaying layers of an x-ray attenuating material on one surface of a silicon substrate.

These and other objects will become clear to those having skill in these arts as the invention is described more fully below.

BRIEF DESCRIPTION OF THE DRAWINGS

FIG. 2A illustrates a lithographic contact mask having a complementary set of witness marks to those of FIG. 1C, placed over the photoresist layer applied in FIG. 1D and aligned to bring the two sets of witness marks into coincidence.

FIG. 2B illustrates the photoresist layer of FIG. 2A being exposed to a source of broadband radiation to expose areas of the photoresist not covered by the contact mask.

FIG. 2C illustrates the photoresist having been developed to remove those exposed portions of the resist.

FIG. 2D illustrates the first x-ray attenuating layer deposited onto the silicon substrate in those areas not covered by the remaining photoresist.

FIG. 11D illustrates the final configuration of the second embodiment of the multilayer x-ray mask.

FIG. 12 illustrates the effect on a uniform flux of x-rays impinging the surface of the second embodiment of the x-ray mask at right angle, reducing the intensity of x-rays passing through various portions of the mask having one, two or no layers of attenuating material blocking the x-rays.

DETAILED DESCRIPTION OF THE INVENTION

Figure 1A:
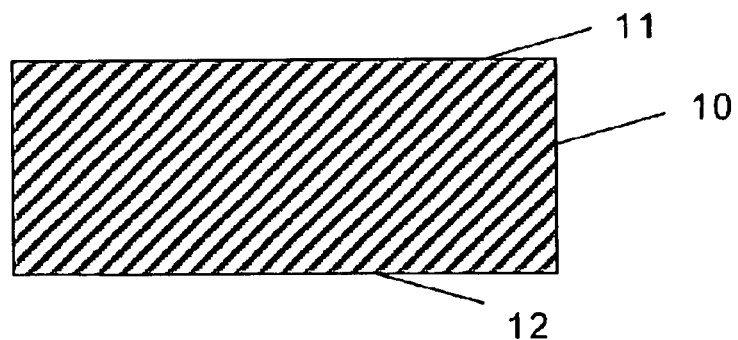
FIG. 1A shows a silicon substrate wafer.

The present invention provides a process for fabricating a robust x-ray mask tool. In particular, the present invention provides a process for fabricating an x-ray mask tool capable of providing a plurality of x-ray dose levels across the face of the mask. Such a mask would have great utility for providing molds for producing microparts which incorporate lei a wide variety of feature sizes and packing densities, i.e., part patterns and geometries which tend to be difficult to develop uniformly. Large widely spaced features tend to develop faster than small closely packed features at the same exposure dose since it is much more difficult for fresh developer to migrate to a reaction interface as the depth-to-width aspect ratio of a feature becomes large.

By "feature" it is meant the volume within the substrate defined by a surrounding wall or channel that is created when the exposed substrate is chemically developed. By "packing density" it is meant the relative number of features per unit area or the relative proximity of a "feature" to an unexposed portion.

General Description

This invention describes a lithographic mask having x-ray attenuating structures applied to one or both sides of an essentially x-ray transparent support media. Furthermore, the invention describes a lithographic mask having features which may be embedded into the thickness of the supporting substrate by a mask, etch, and plating process described in co-pending U.S. patent application Ser. No. 09/636,002, entitled "X-ray Mask and Method for Providing Same" filed on Aug. 9, 2000 and herein incorporated by reference.

The process begins with a standard silicon wafer or disc. The two "faces" of the substrate, i.e., each of the two large, flat surfaces of the wafer or similar article, are first "metallized" by depositing one or more metal layers onto the surfaces of the substrate. The metallizing layers are quite thin—typically a few hundred angstroms, and are used to provide a conductive deposition layer for subsequent processing. After metallizing the substrate a number of "witness" marks are applied onto one of the two plated surfaces. The marks are placed at several locations on one face of the substrate. The witness marks will be used, subsequently, as alignment aids for establishing pattern registration between the substrate top and bottom faces.

A polymer photoresist is placed onto a top surface opposite the surface with the witness marks such that the layer is several microns thick. The method of application and composition of the resist is not critical: any technique for applying such layers may be used, including dipping, spraying, spinning or vapor depositing, and either organic or inorganic resists may be used.

The resist layer is baked, or otherwise cured, and the desired image pattern rendered onto the top layer surface by using any conventional lithographic processes, e.g., by a direct contact transmission mask, by imaging the reflection of a non-contact mask through camera optics onto the resist surface, or by directly "writing" the image by using a programmable e-beam writer. Each type of masking technique employs some method of pattern alignment registration such as a corresponding set of witness marks designed to complement those marks "written" onto the metallized surface of the silicon substrate. Important to the proper operation of the invention is the ability to co-locate the position of the mask with respect to the witness marks on the underside of the substrate.

After establishing the position of the mask with respect to the substrate, the image of the mask is rendered into the resist by well-known lithographic techniques. The resist layer is then chemically "developed" and the exposed areas of the resist either removed or retained, depending upon the specific resist chemistry used.

Following the development of the resist, the patterned substrate is coated with a "thick" layer of gold or some similar metal selected from the IUPAC group of Transition metals in new Groups 4–12, plus aluminum and tin. The term "thick" is used here in a relative sense to mean 1 to 3 orders of magnitude thicker then the initial several hundred angstrom thick metallize layer. Typically this layer would range from about 0.1 microns to about 5 microns in thickness depending upon the amount of x-ray attenuation desired. Coating is typically done by electroplating or by electroless deposition onto the metallize layer but may be done by any method providing the applied layer is uniform in composition and structure and provides a continuous, condensed layer. The thick x-ray attenuating layer may be laid down, for instance, by particle vapor deposition, chemical vapor deposition, plasma spraying, or epitaxy deposition. Time and cost, however, favor a plating process.

Once plated, the incipient mask is planarized by lapping the top plated surface layer down to the resist layer and then chemically removing the remaining resist leaving only the patterned metal layer on the substrate surface.

Finally, the foregoing process is repeated a second time to apply a second x-ray attenuating layer having a second pattern to the opposite surface of the substrate. This second pattern is designed to overlap various portions of the first pattern and thus provide an added thickness of attenuating material through which the radiation must pass. What is provided therefore, is a "stepped", "graded" mask pattern permitting reduced radiation exposure over specific regions on the mold.

This second pattern layer is provided by inverting the coated and patterned substrate and once again aligning the image forming mask with the witness marks applied to the first surface of the substrate. As before, the substrate second surface is coated with a resist layer, imaged by means of a second, similar, imaging mask, the resist developed and the back surface (second) of the substrate, coated, as before, with gold or some similar metal selected from the aforementioned list of Transition metals. The second surface is then planarized and the remaining resist removed leaving a two sided x-ray mask. Alternately, the second surface pattern imaging step may be performed immediately after the first imaging step has been rendered but not developed. This has the advantage of requiring only one step to develop, and one step to plate (or deposit) rather than two, and thus avoiding potential damage to the mask due to handling.

It should be noted that as a practical matter the silicon substrate comprises a disc, or "wafer," which is thinned to adjust the wafer thickness to a useful point since the silicon itself can be used to attenuate radiation. Thinning, of course, must be done prior to second surface processing. Furthermore, depending on the desired final thickness of the substrate it may be necessary to provide the wafer with a series of internal "ribs" criss-crossing the thinned surface to support and strengthen the finished mask.

Unfortunately, such structures are potentially incompatible with a second surface mask pattern and an alternate embodiment is necessary to overcome this difficulty. In order to provide a mask comprising the benefit of the two surface mask patterns, while still allowing for the possibility of thinning the substrate, it is necessary to place both patterns on the same surface of the wafer. This may be done by embedding the first pattern into the thickness of the substrate, as taught by co-pending U.S. patent application Ser. No. 09/636,002, herein incorporated by reference, followed by a second pattern imaging and deposition process applied over the embedded pattern. Alternately, a second technique provides a two step pattern imaging and deposition process wherein a second pattern layer is placed directly on top of a first layer forming, thereby, a "stepped" mask.

Specific Description

As required, detailed embodiments of the present invention are disclosed herein. However, it is to be understood that the disclosed embodiments are merely exemplary of the present invention which may be embodied in various systems. Therefore, specific details disclosed herein are not to be interpreted as limiting, but rather as a basis for the claims and as a representative basis for teaching one skilled in the art to variously practice the present invention.

Several embodiments are disclosed hereunder: embodiment 1 refers to a two surface mask wherein first and second imaging patterns are deposited on top and bottom surfaces of the silicon substrate wafer; embodiment 2 refers to a two layer mask comprising a first imaging layer embedded into a first surface and a second overlaying imaging layer; embodiment 3 refers to a two layer mask comprising a first imaging layer on a first surface and a second overlaying imaging layer deposited onto the first layer.

First Embodiment

One embodiment of the steps of the invention are described with reference to FIGS. 1 through 5.

Referring to FIG. 1A, the process begins with a silicon substrate or wafer 10. This substrate can, generally, have any useful shape and thickness but should of necessity be a thin wafer having parallel top and bottom surfaces 11 and 12. In particular the present invention is most easily implemented by using an industry standard 100 mm Ø×0.67 mm thick wafer. However, because the standard wafer thickness is much too thick to allow standard fluxes of x-rays to penetrate, these wafers must be thinned first using a conventional blanket etch to reduce its thickness below about 100 microns. Etching is performed only in selective zones in order to leave sufficient structural support for further processing the wafer. All FIGURES shown for this embodiment, therefore, are intended to show only a limited cross section of wafer 10 in an area thinned by the blanket etching process.

Figure 1B:
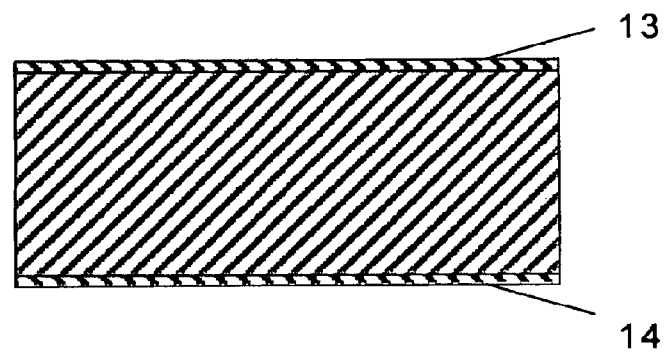
FIG. 1B illustrates the wafer of FIG. 1A having an initial adhesion layer deposited on the two surfaces of the wafer.
Figure 1C:
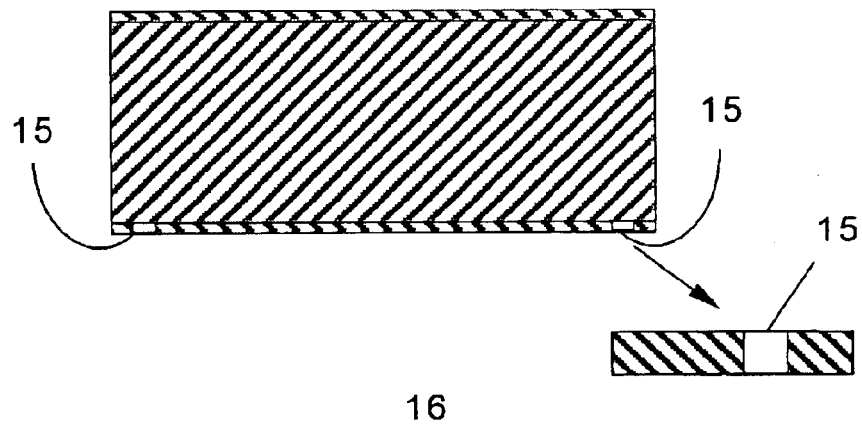
FIG. 1C shows witness marks written onto one of the two adhesion layers.

In FIG. 1B the process begins with "faces" 11 and 12, of the substrate being "metallized" by depositing a first layer of chromium followed by a second layer of gold in order to provide first and second surfaces 13 and 14. By "faces" it is meant each of the two large, flat surfaces of the wafer or similar article. First and second metallized layers 13 and 14 are quite thin—typically several hundred angstroms, respectively, and are used to provide a conductive deposition layer for subsequent processing. Metallization is performed by any known technique including but not limited to vapor phase deposition, particle deposition, or epitaxial deposition.

After metallizing the substrate several "witness" marks 15 are applied onto one of the two metallized surfaces. This may be done by using any conventional lithographic technique or by "writing" the pattern directly into the metallized coating by means of an electron beam or laser such that the "witness" marks in the metallized layer are removed. The marks are placed at several locations remote, possible peripheral, points on one "face" of the substrate. The witness marks will be used, subsequently, as alignment aids for establishing mask pattern registration between the substrate top and bottom metallized surfaces 13 and 14.

Figure 1D:
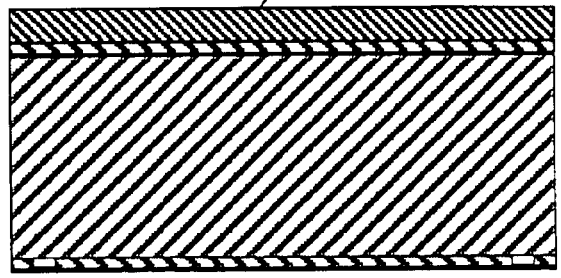
FIG. 1D shows the silicon substrate coated with a photoresist layer on the surface opposite the witness marks applied in FIG. 1C.

In FIG. 1D a liquid photoresist film 16 (herein Shipley SJR5740) is applied by spin coating to a thickness of less than about 50 microns, preferably from about 5 to 20 microns, and then baked at a temperature of 110° C. for about 10 minutes in order to at least partially cure the resist layer. The particular resist thickness is chosen so as to provide a stencil form for a thick absorber layer while still providing for fully exposing the full thickness of the resist during the light exposure phase.

In a next step, shown in FIG. 2A, a standard direct-contact lithographic mask 17, herein embodying a negative trace image of the desired pattern 18, is placed on the surface of resist layer 16. Alternately, it is known to those skilled in the art that proximity exposure is also effective as a means for providing the requisite trace image.

Mask 17 is provided with corresponding witness marks 19 and aligned such that witness marks 19 on the mask and witness marks 15 the underside of the metallized substrate are brought into coincidence, as seen in FIG. 2A (mask 17 is shown above the surface of resist layer 16 for clarity sake only). This may be done by first fixing the position of the substrate and then moving the mask over the substrate by means of a standard x-y translatable stage driven by a pair of precision stepper motors (not shown). Mask 17 and substrate 10 are aligned by imaging the underside of the substrate, metallized surface 14, with its witness marks 15, using conventional microscopy and camera optics and combining this image with an image of the corresponding set of witness marks 19 in pattern-forming mask 17. By carefully adjusting the x-y stage the two sets of witness marks may be brought into coincidence or are otherwise uniquely arranged.

Once the mask and substrate are properly aligned, the portions of the resist layer 16 exposed by the open areas of the mask are subjected to a source (not shown) of broadband light, 20, herein shown in FIG. 2B. The exposure source used herein was a high pressure mercury-vapor lamp emitting light over a spectral range of about 365 nm to 450 nm and providing a dose of approximately 1000 millijoules/cm$^2$ measured at a wavelength of 365 nm.

In the next step in the process, illustrated in FIG. 2C, the photoresist is chemically "developed" and the exposed portions, 21a, of photoresist layer 16 are removed. What remains are the unexposed portions, 21b, of the resist in an inverse image of the mask pattern wherein this inverse image comprises "clear" areas 22 exposing portions of the underlying metallize layer 13. Again, this step is performed using standard and well-known lithographic processes.

It should be noted that the choice of a positive or negative image mask depends largely on the nature of the photoresist used, i.e., depending upon whether or not the exposed portion of the photoresist is removed or left intact after the resist has been developed. Either approach is possible, although, depending on the nature of the desired pattern, one is usually more preferred than the other.

After cleaning and drying the developed mask, those portions of the mask surface which have been uncovered during the photoresist development process (open areas 22) are subsequently covered with a thin, pin-hole free metal film 23, such as that shown in FIG. 2D. The chosen process for applying the coating of FIG. 2D is either electrochemically or electroless plated although any other coating process which would provide such a layer would be equally effective. Such methods could include, but are not limited to, thermal evaporation or particle vapor deposition (PVD) process, chemical vapor deposition (CVD), sputtering and spraying coating methods. As disclosed herein, the film 23 is rendered In gold and is as thick as the resist layer. Any similar metal or combination of metals would be equally useful including most of the metals in the Transition series of metal listed in New IUPAC Group Numbers 4∝12 of the Period Table of elements, alloys thereof, and certain of the metals of Groups 13 and 14, such as aluminum and tin providing that the thickness of the metal layer is adjusted to provide for attenuating radiation to a desired level. Following this step of depositing the x-ray absorbing layer 23, the mask assembly is planarized, as shown in FIG. 2D, to remove metal from across the top surface of the photoresist 22. Planarizing is typically performed by lapping the top surface to remove the "overburden" metal layer and developing and removing the remaining photoresist layer. Close control of the final desired pattern thickness can be achieved by lapping, however, it is generally easier to simply time the plating process.

Figure 3A:
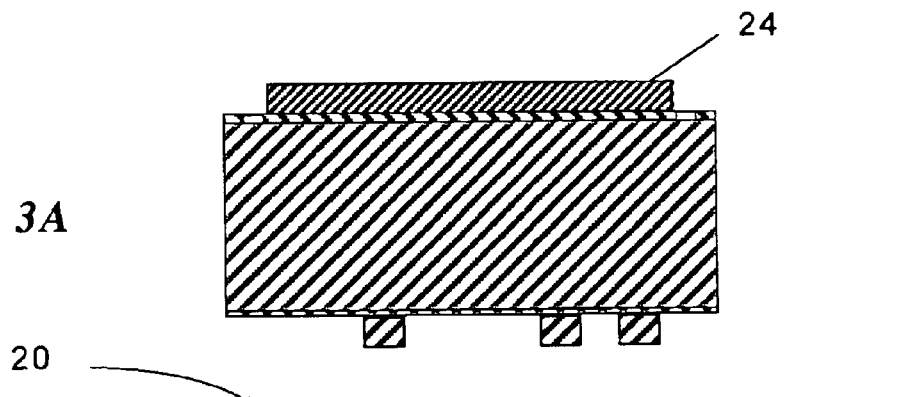
FIG. 3A shows the plated substrate having had the remaining resist material removed from the first surface and having been inverted and a second photoresist layer applied to the second surface. The second resist layer applied so as to avoid covering the witness marks of FIG. 1C.

To complete the variable dosing x-ray mask a second pattern layer 24 is now laid down on the wafer face opposite first pattern 18 by repeating the steps of FIGS. 1D through 2D in the same manner as discussed above. In FIG. 3A a second resist film 24 (Shipley SJR5740) is applied by spin coating to a thickness of less than about 50 microns, preferably from about 5 to 20 microns, and then baked at a temperature of 110° C. for about 10 minutes in order to at least partially cure the resist layer. The particular resist thickness is again chosen so as to provide a stencil for a thick absorber layer while still providing for fully exposing the full thickness of the resist during the light exposure phase. Importantly, clear zones 24a are provided along the outside edge of substrate 10 by covering the substrate edge with a template or barrier prior to resist coating. This is done in order not to obstruct witness marks 15.

Figure 3B:
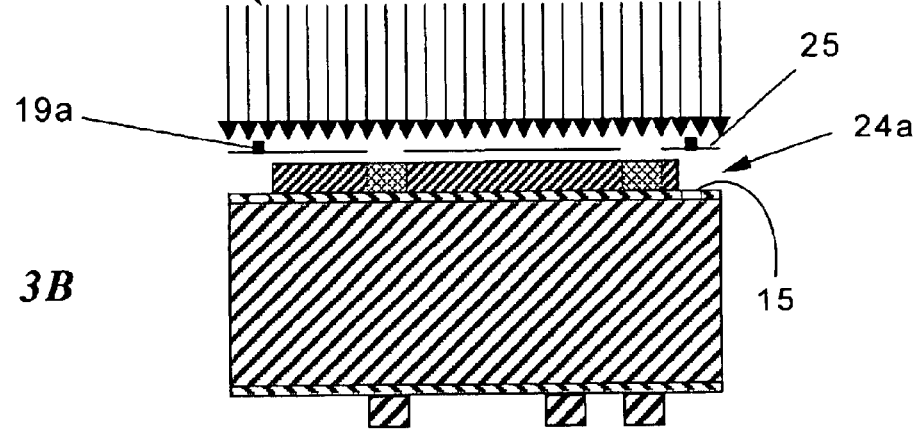
FIG. 3B illustrates a second lithographic contact mask placed over the second photoresist layer applied in FIG. 3A, the second mask having the same set of witness marks as the first mask of FIG. 2B, wherein the two sets of witness marks are brought into coincidence as before, and the resist layer exposed to a source of broadband radiation to expose areas of the resist not covered by the contact mask.

In FIG. 3B, another direct-contact lithographic mask 25 again embodying a negative trace image of the desired second pattern 26, is placed over the surface of resist layer 24. Mask 25 is provided with a duplicate set of witness marks 19a and aligned such that marks 19a are brought into coincidence with marks 15 in the metallized substrate. As before, this may be done by fixing the position of the substrate and then moving mask 25 over the substrate by means of the x-y translatable stage (not shown). and imaging the substrate metallized surface 14 and its witness marks 15, using conventional microscopy and camera optics to combine this image with an image of the corresponding set of witness marks 19a.

Once the mask and substrate are aligned, the portions of the resist layer 24 exposed by the open areas in the mask are subjected to a source (not shown) of broadband light, 20, herein shown in FIG. 3B. The exposure source used herein was a high pressure mercury-vapor lamp emitting light over a spectral range of about 365 nm to 450 nm and providing a dose of approximately 1,000 millijoules/cm$^2$ measured at a wavelength of 365 nm.

Figure 3C:
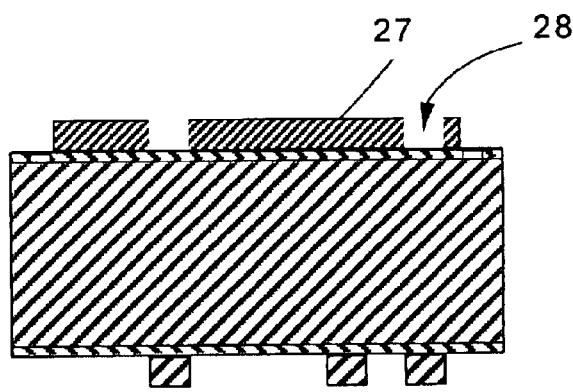
FIG. 3C shows the photoresist having been developed to remove those exposed portions of the resist.

In FIG. 3C, the photoresist has been chemically "developed" and the exposed portions of photoresist layer 24 are removed. What remains are the unexposed portions, 27, of the resist in an inverse image of the mask pattern wherein this inverse image comprises "clear" areas 28 exposing portions of the underlying metallize layer 14. Again, this step is performed using standard and well-known lithographic processes.

Figure 3D:
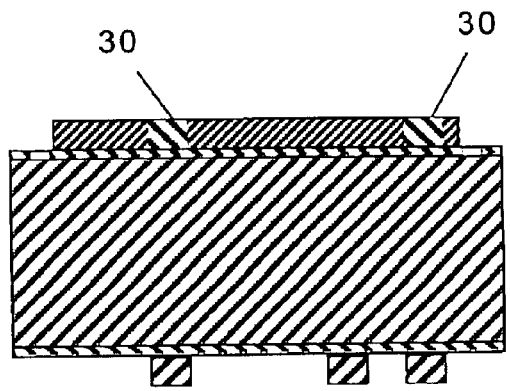
FIG. 3D illustrates the second x-ray attenuating layer deposited onto the silicon substrate in those areas not covered by the remaining photoresist.
Figure 4:
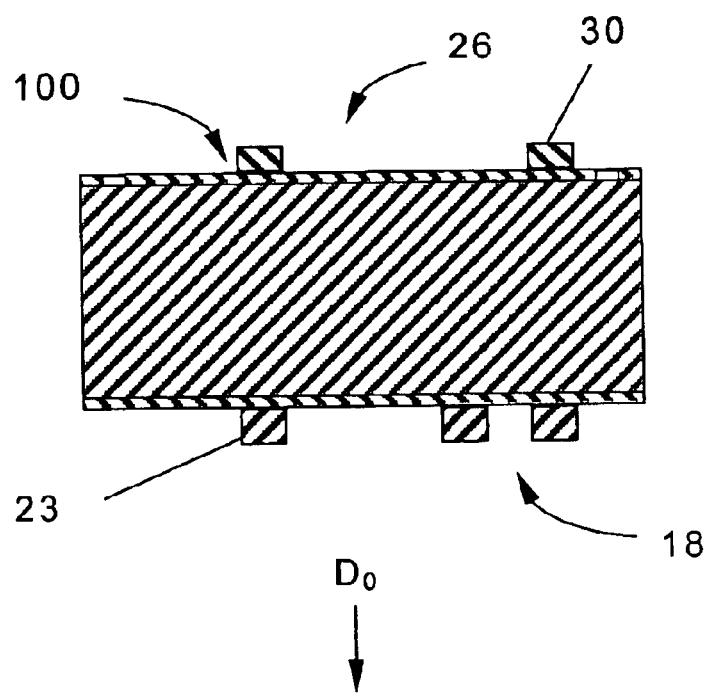
FIG. 4 shows the final configuration of a two-sided x-ray mask tool wherein the remaining portions of the second resist layer are removed.

After cleaning and drying the developed mask, those portions of the mask surface which have been uncovered during the photoresist development process (open areas 28) are subsequently covered with a thin, pin-hole free metal film 30, as shown in FIG. 3D. The chosen process for applying the coating of FIG. 3D may be either by means of electrochemical or electroless plating although any other coating process which would provide a continuous layer would be equally effective. Such methods could include, but are not limited to, thermal evaporation or particle vapor deposition (PVD) process, chemical vapor deposition (CVD), sputtering and spraying coating methods. As disclosed herein, the film 30 is rendered in gold and is as thick as the resist layer. Any similar metal or combination of metals would be equally useful including most of the metals in the Transition series of metal listed in New IUPAC Group Numbers 4–12 of the Period Table of elements, alloys thereof, and certain of the metals of Groups 13 and 14, such as aluminum and tin providing that the thickness of the metal layer is adjusted to provide for attenuating radiation to a desired level. Following this step of depositing the x-ray absorbing layer 30, the mask assembly is planarized, as shown in FIG. 4D, to remove metal from across the top surface of the photoresist 24. Planarizing is typically performed by lapping the top surface to remove the "overburden" metal layer and developing and removing the remaining photoresist layer.

The sole remaining issues are 1.) the registration of the second pattern with the first pattern in order that pattern features overlap within an achievable tolerance limit, and 2.) achieving a desired level of additional attenuation of the incoming radiation flux sufficient to slow development in selective areas in order that all areas develop at about the same rate. Accomplishing the first of these tasks is made somewhat easier since it is the larger open areas (areas to be removed during developing) surrounding isolated features in which the development reaction is desired to be slowed and therefore must be underexposed to the radiation. Since it is only necessary that most of this area be underexposed, it is not necessary that the patterns exactly match each other so long as the profile of one pattern does not extend over the profile of the other. The pattern closest to the incoming beam of radiation may be used to establish the desired overall size and shape of the finished mold while the second, overlapping pattern may be laid down slightly smaller than the primary pattern such that its image does not overlap that of the primary pattern. This has the effect of slowing PMMA development over most of the larger portion to be removed while still providing proper definition for the final part without the need for the extremely precise registration necessary if a near zero stack-up tolerance is required between patterns.

Accomplishing the second issue requires some experimentation in order to determine the desired reduction in mold dissolution rate since this factor will depend to a large extent on the geometry and packing density of the parts comprising the mold. In general, however, these effects have been addressed previously in an article by Griffiths, et al., entitled "the influence of feature sidewall tolerance on minimum absorber thickness for LIGA x-ray masks," published in *J. Micromech. Microeng.*, vol. 9 (1999) pp. 353–361, herein incorporated by reference. This article provides numerical solution with which to estimate the total local dose rate of x-rays transmitted by a hypothetical x-ray mask.

Figure 5:
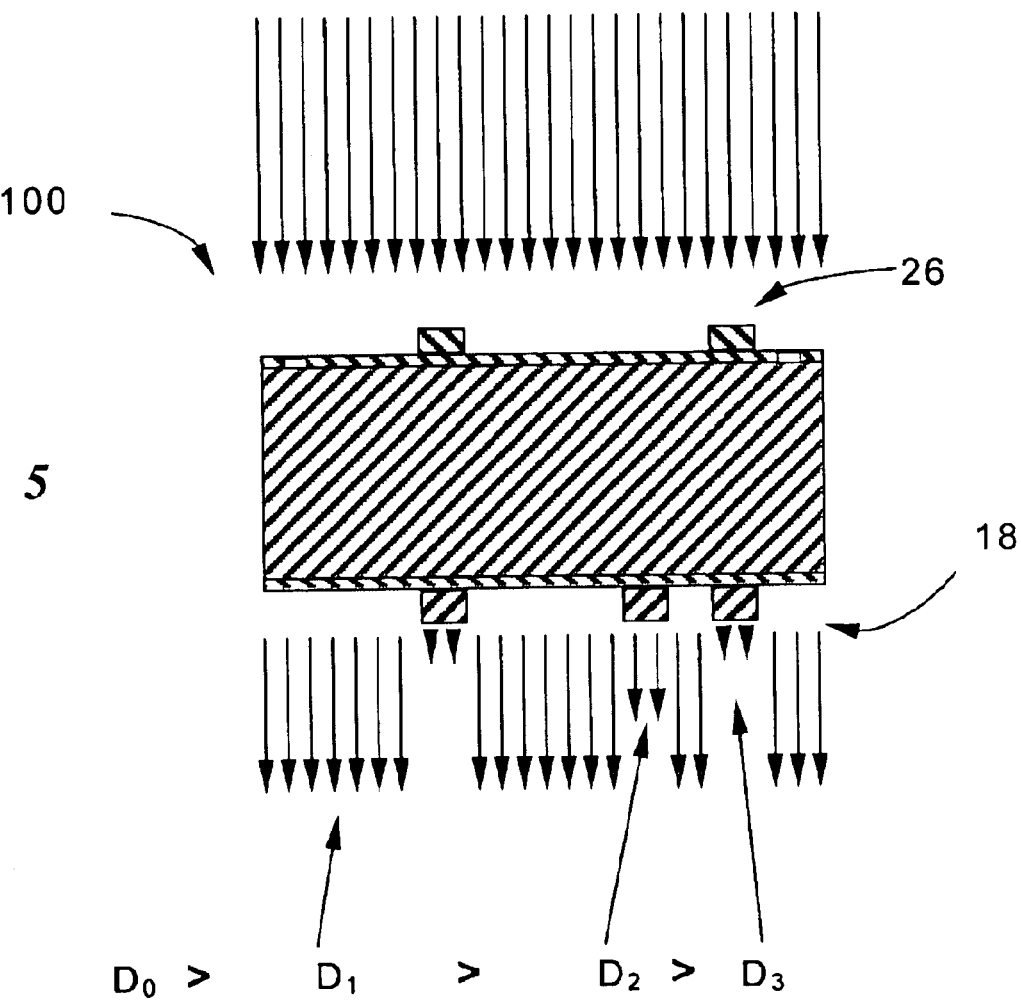
FIG. 5 illustrates the effect on a uniform flux of x-rays impinging the surface of the mask at right angle, reducing the intensity of x-rays passing through various portions of the mask having one, two or no layers of attenuating material blocking the x-rays.

Operation of mask 100 is shown schematically in FIG. 5, wherein collimated x-ray radiation strikes the mask perpendicularly to surfaces 11 and 12. In those areas where the x-ray flux merely passes though the thinned silicon substrate the x-ray flux is $D_1$. In those areas where the radiation is obstructed by pattern 18 or 26 the radiation flux $D_0$ is attenuated to flux $D_2$. Where the radiation is obstructed by both of patterns 18 and 26, the radiation flux is further attenuated to a flux $D_3$.

Second Embodiment

A second embodiment of the present invention follows many of the first steps developed in embodiment one, but adds several additional steps to provide the etched trench feature of this embodiment. These steps are described with reference to FIGS. 6 through 12.

Figure 6A:
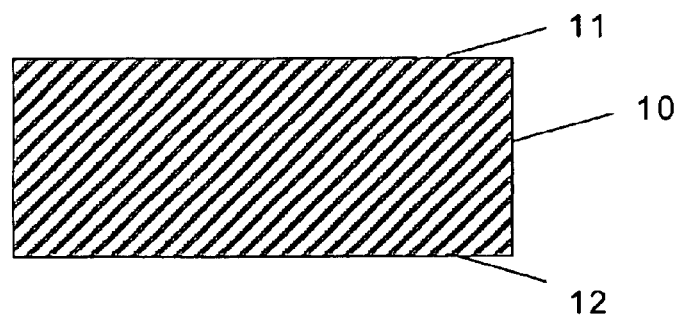
FIG. 6A shows a silicon substrate wafer.

Referring to FIG. 6A, the process for embodiment 2 begins, as before, with silicon substrate or wafer 10. This substrate can, generally, have any useful shape and thickness but should of necessity be a thin wafer having parallel top and bottom surfaces 11 and 12. In particular, the present invention is most easily implemented by using an industry standard 100 mm Ø×0.67 mm thick wafer. Again, the thickness of a standard wafer is too great to allow transmission of standard fluxes of x-rays,i the wafer must be thinned. Unlike embodiment 1, however, because embodiment 2 applies the x-ray moderating layer only to one face of the substrate, the thinning step may be preformed as a final step. The FIGURES shown for this embodiment, therefore, are not necessarily intended to show only a cross section of wafer 10 in an area thinned by the blanket etching process.

Figure 6B:
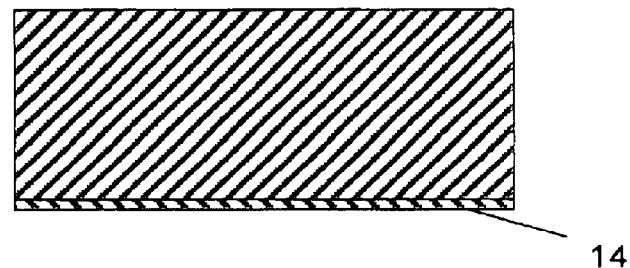
FIG. 6B illustrates the wafer of FIG. 6A having an initial adhesion layer deposited on one of the two surfaces of the wafer.
Figure 6C:
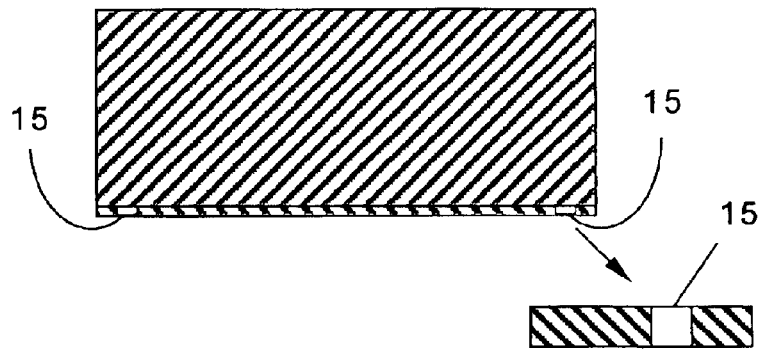
FIG. 6C shows witness marks written onto one of the adhesion layers.

The process begins by "metallizing" one of the two surfaces of the substrate wafer, FIG. 6B. Again, metallization is performed by depositing a layer of gold over a layer of chromium as in embodiment 1. Furthermore, like the first embodiment the function of the metallize layer is to provide a surface for "writing" witness marks 15, shown in FIG. 6C, which are used to align first and second image patterns. Again, the metallization is performed by any known technique including but not limited to vapor phase deposition, particle deposition, or epitaxial deposition.

Figure 6D:
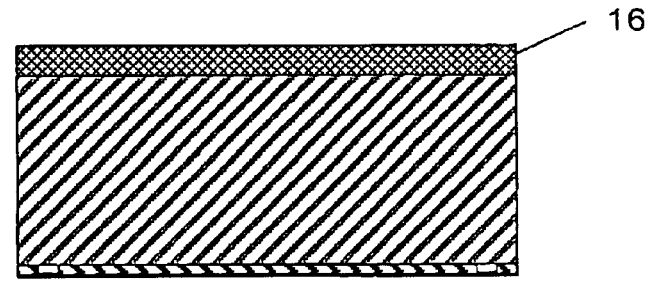
FIG. 6D shows the silicon substrate coated with a photoresist layer on the surface opposite the witness marks applied in FIG. 6C.

In FIG. 6D a liquid photoresist film 16 (herein SRP 3612 Novolak) is applied by spin coating, in this case, to a thickness of less than about 2 microns, preferably from about 1 to 1.5 microns, and then baked at a temperature of 95° C. for about 90 seconds in order to at least partially cure the resist layer. The particular resist thickness is chosen so as to balance the need for providing a thick enough layer to protect the unexposed portions of the silicon substrate from the effects of the latter ion etch phase against the desire to fully expose the full thickness of the resist during the light exposure phase.

Figure 7A:
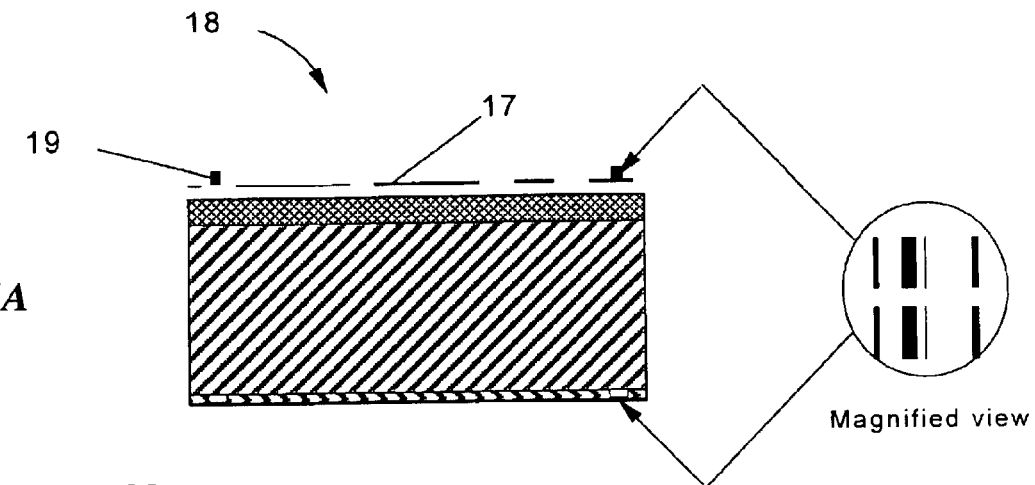
FIG. 7A illustrates a lithographic contact mask having a complementary set of witness marks to those of FIG. 6C, placed over the photoresist layer applied in FIG. 6D and aligned to bring the two sets of witness marks into coincidence.

A standard direct-contact lithographic mask 17, herein embodying a negative trace image of the desired pattern 18, is placed on the surface of resist layer 16 and aligned such that witness marks 19 on contact mask 17 and witness marks 15 on metallized surface 14 are brought into coincidence as seen in FIG. 7A (FIG. 7A intentionally shows contact mask 17 above this surface for clarity sake only). This may be done by first fixing the position of substrate 10 and then moving the mask 17 over the substrate by means of a standard x-y translatable stage driven by a pair of precision stepper motors (not shown). Contact mask 17 and substrate 10 are aligned by imaging the underside of the substrate, metallize surface 14, with its witness marks 15, using conventional microscopy and camera optics and combining this image with an image of the corresponding witness marks 19 written into contact mask 17. (It is important, in this embodiment that witness marks 15 be placed on the substrate face opposite the subsequent embedded layer since, as will be seen, it will be necessary to planarize this surface after depositing the x-ray absorber material onto the first face of the substrate, inevitably removing the top surface metallize layer.)

Figure 7B:
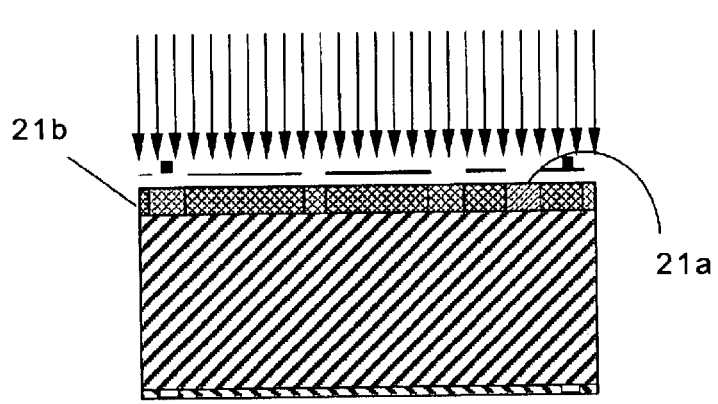
FIG. 7B illustrates the photoresist layer of FIG. 2A being exposed to a source of broadband radiation to expose areas of the photoresist not covered by the contact mask.

Once the mask and substrate are properly aligned the portions of the resist layer 16 exposed by the openings in contact mask 17 are subjected to a source (not shown) of broadband light, 20, herein shown in FIG. 7B. The exposure source used herein was a high pressure mercury-vapor lamp emitting light over a spectral range of about 365 nm to 450 nm and providing a dose of approximately 1000 millijoules/cm² measured at a wavelength of 365 nm.

Figure 7C:
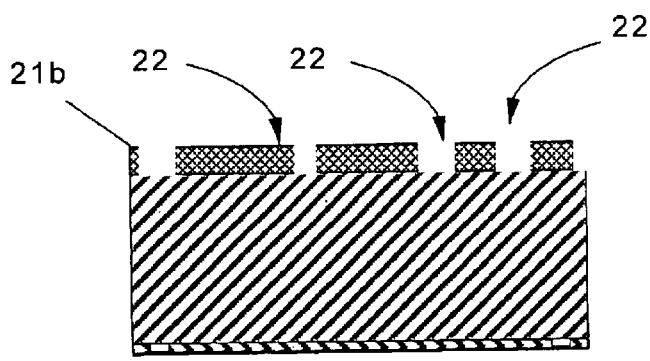
FIG. 7C illustrates the photoresist having been developed to remove those exposed portions of the resist.

In the next step in the process, illustrated in FIG. 7C, the photoresist is chemically "developed" and the exposed portions, 21a, of photoresist layer 16 are removed. What remains are the unexposed portions, 21b, of the resist in an inverse image of the mask pattern (and thus a positive image of the desired mold part) and "clear" areas 22 of exposed silicon whose edges eventually define the walls of the mold structure. As will be seen in the next steps, clear areas 22 comprise regions of the substrate that will be removed by an etching process and later filled with an x-ray obstructing metal layer.

Figure 8A:
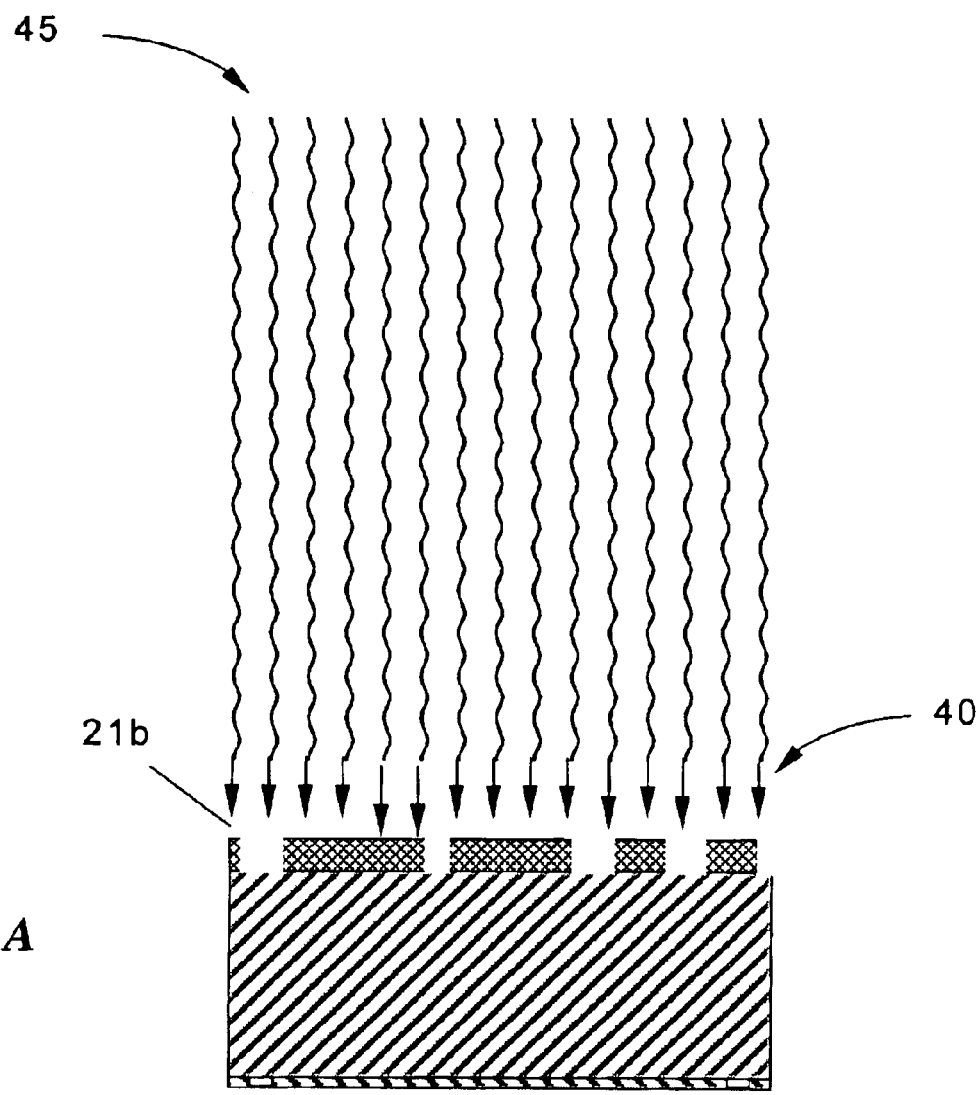
FIG. 8A illustrates the silicon substrate covered by the developed photoresist in which exposed portions of the substrate are subjected to a reactive ion plasma used to deeply etch the silicon substrate.
Figure 8B:
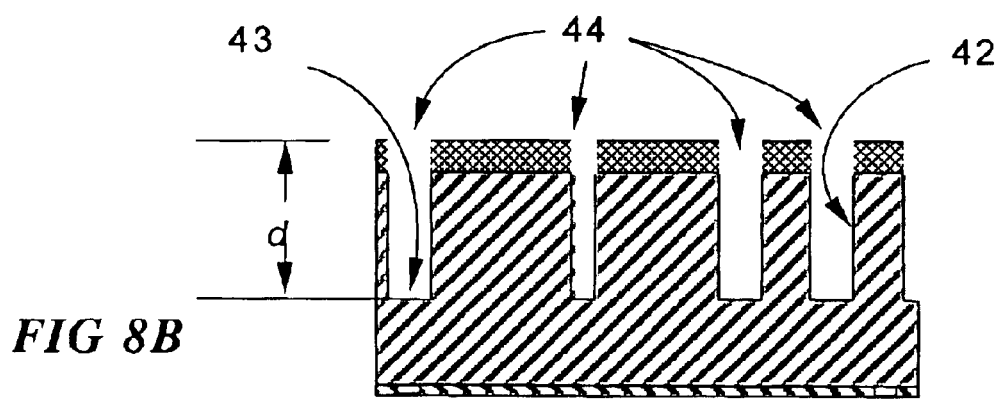
FIG. 8B illustrates the silicon substrate covered by the developed photoresist after the exposed portions of the substrate have been deeply etched.

After cleaning and drying, the patterned substrate 40 is subjected to a series of anisotropic reactive etching steps such as those set forth in the so-called BOSCH process described in U.S. Pat. No. 5,501,893, herein incorporated by reference in its entirety. FIG. 8A shows this step applied in the present invention. In this process pattern substrate 40 is subjected to a reactive ion plasma 45. The patterned top surface of the silicon substrate is protected from bombardment of the ion species by the retained resist layer 21b. This first etching step is followed by a first polymerization step (not shown) which coats the walls, edges and bases of the etched recesses in the silicon substrate and the process of FIG. 8A is repeated as many times as is necessary until a final depth d, shown in FIG. 8B, is achieved.

Herein, the BOSCH technique (or any other similar etch-and-coat technique), etches the 'clear' areas 22' of the patterned silicon substrate 40 to a depth d and is used primarily to provide a very straight wall edge for etched channels 44. As noted supra. the BOSCH process is a two step etch-and-coat process wherein the intervening coating step comprises coating the exposed silicon with a thin layer of a polymer film (not shown) which protects the walls 42 and bases 43 of etched channel 44 but is quickly destroyed on those surfaces which directly face the bombardment of the reactive plasma 45 shown in FIG. 8A. This action has the effect of etching regions in the exposed silicon which have a substantially uniform width and substantially parallel walls. The process continues until the desired etch depth d has been achieved. In the case of the present invention the desired depth was about 30 microns and is intended to attenuate transmission of x-ray flux having an incoming energy of about 10 KeV to near zero. The BOSCH pattern rendered in the silicon wafer is a print-negative image of the desired mold configuration to be produced by the x-ray mask.

Figure 9A:
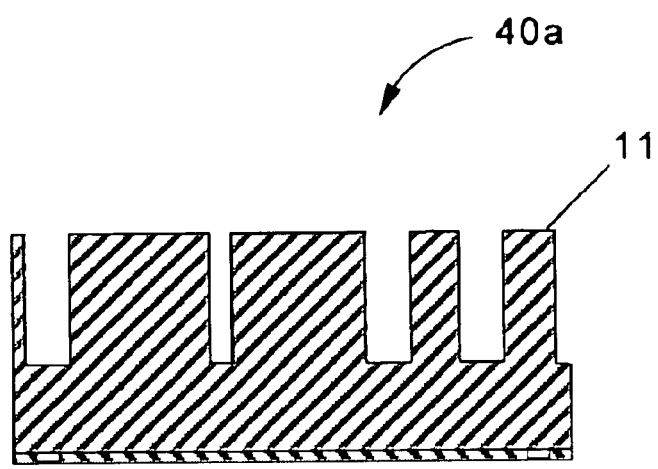
FIG. 9A shows the etched silicon substrate, wherein the remaining photoresist is removed.
Figure 9B:
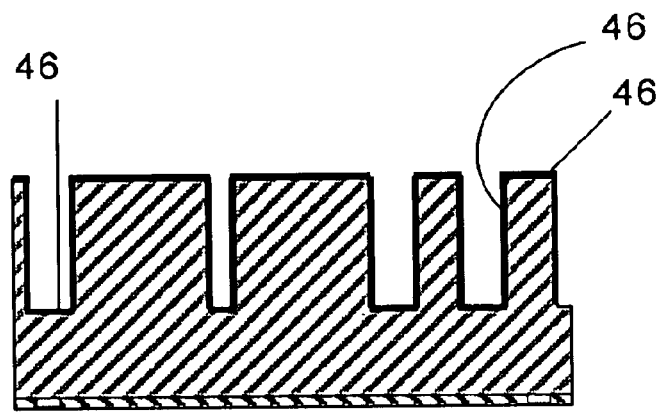
FIG. 9B shows the silicon substrate wherein a thin metal adhesion layer has been deposited such that the entire top surface of the substrate, those portions which are etched and those which are not, is coated.

After etching patterned substrate 40 to the desired depth, the remaining resist layer 21b is removed, and the part cleaned, leaving a plurality of deeply etched channels across top surface 11 of the substrate as shown in FIG. 9A. Surface 11 of the patterned substrate 40 is subsequently covered with a thin electrically conductive metal film 46, as shown in FIG. 9B. Film 46 is necessary to enable adherence of a second, thicker metal layer 47 which is deposited in a subsequent step. The chosen process for applying the first thin coating is a thermal evaporation or particle vapor deposition (PVD) process, although any other coating process which would provide a thin, continuous layer of conductive material would be equally effective. However, any such processes must be able to coat both the walls 42 and the bases 43 of the etched channels 44. Such methods could include, but are not limited to, sputtering and chemical vapor deposition or spraying coating methods, and electrochemical and electroless plating methods, and only require that the coating process provide a continuous, adherent, and conductive layer.

As disclosed herein, film 46 is about a 0.025 microns layer of chromium with an overlaying layer of about 0.08 microns of gold. Any similar metal or combination of metals would be useful including most of the metals in the Transition series of metal listed in New IUPAC Group Numbers 4–12 of the Period Table of elements, alloys thereof, and certain of the metals of Groups 13 and 14, such as aluminum and tin.

Figure 9C:
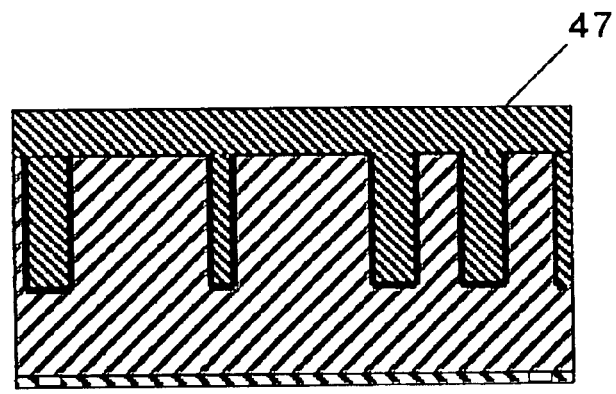
FIG. 9C shows the metal coated silicon substrate having a second, thicker x-ray attenuation layer deposited such that the etched portions on the substrate are completely filled.

As shown in FIG. 9C, thicker layer 47 is also chosen to be gold but ,as before, could be any similar metal selected from the list supplied above, providing that the etch depth d of the mask is adjusted to provide for a layer of sufficient thickness to eliminate most of the synchrotron radiation emanating from the light source used to illuminate the mask.

Figure 10A:
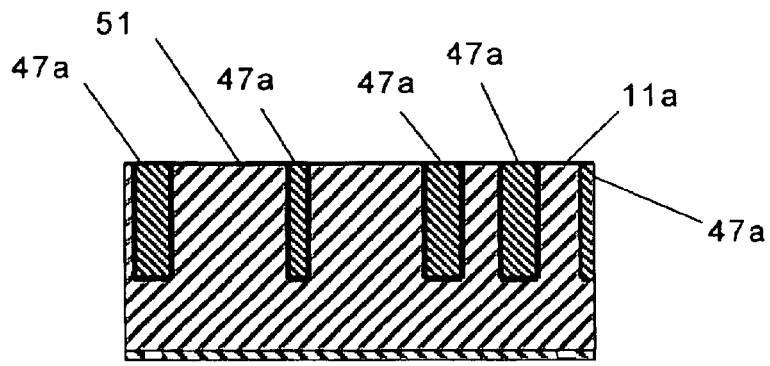
FIG. 10A shows the removal of the excess thick gold layer from the top surface of the silicon substrate by planarizing that surface until the silicon substrate is again exposed.
Figure 10B:
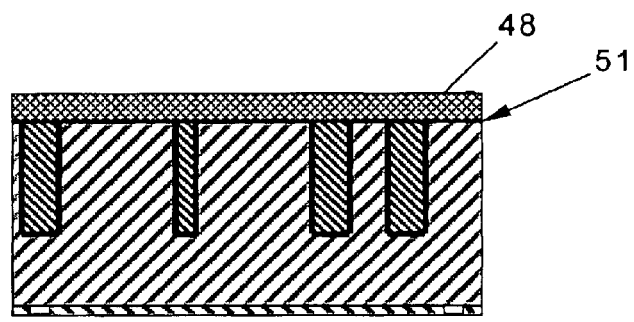
FIG. 10B shows a second resist layer applied to the first surface of the substrate.

Following the step of depositing second layer 47, the mask assembly is planarized to provide the structure shown in FIG. 10A. Unlike the step of planarizing in embodiment 1, however, the present step is performed to remove metal from across top surface 11 down to the surface of the substrate 10 to provide planarized surface 11a. This surface is intended to be as flat and smooth as possible since it is the surface which will lay against the surface of the material onto which the synchrotron radiation is to be illuminated. As before, planarizing is performed by lapping the top surface until the surface of the silicon is reached leaving only the portion 47a of layer 47 embedded into the thickness of substrate 10 exposed and exposed portions 47a provide an obstruction to the transmission of synchrotron radiation in those areas of the mask intended to form the exterior walls of the final structures in the PMMA mold. Portions 47a thus collectively comprise a negative image of the structures that are to be exposed to synchrotron radiation.

After the planarizing step has been completed, the x-ray mask of embodiment 2 is prepared for a final finishing x-ray absorber layer by first applying a thin (a few hundred Angstroms) conductive metal layer 51 onto surface 11a by a particle or vapor deposition process, as shown in FIG. 10A This metal coating will eventually form the substrate for subsequent final overlaying metal layer across those areas of the mask in which some moderation of the full flux of the synchrotron radiation source is desired. These steps are shown in FIGS. 10B through 11C.

Figure 10C:
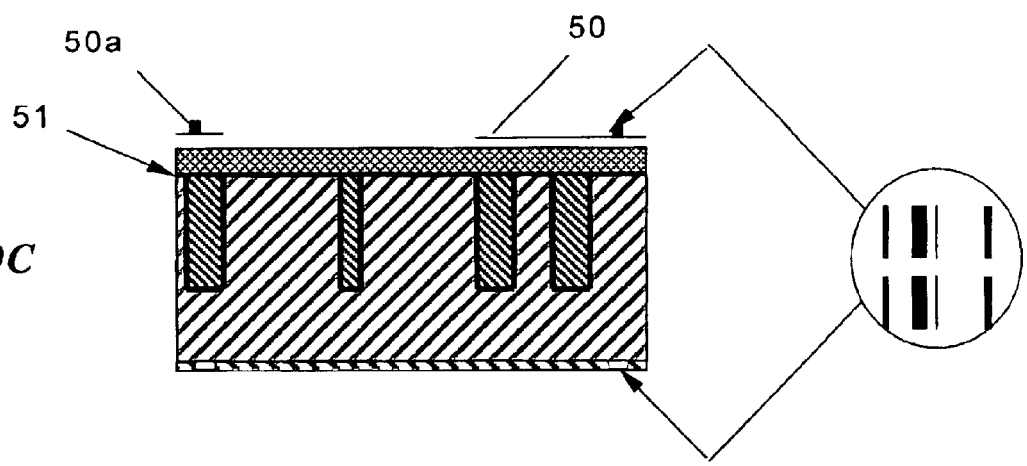
FIG. 10C illustrates a second lithographic contact mask placed over the second photoresist layer applied in FIG. 10B, the second mask having the same set of witness marks as the first mask of FIG. 6C, wherein the two sets of witness marks are brought into coincidence.

The overlaying layer is applied by the same lithographic process illustrated in FIGS. 6 through 7. The metal coated silicon wafer of FIG. 1A is coated with a thick photoresist layer 48 and a second image forming contact mask 50 is placed over the surface of resist layer 48 and aligned as before. As before the image forming mask is aligned by first fixing the position of the substrate and then moving the mask over the substrate using a standard x-y translatable stage driven by precision stepper motors (not shown). Contact mask 50 and etched substrate 40a are aligned by again imaging the underside surface 14 of the substrate with its witness marks 15 using conventional microscopy and camera optics and combining this image with an Image of a corresponding set of witness marks 50a written onto contact mask 50. Again, by carefully adjusting the x-y stage the two sets of witness marks may be brought Into coincidence, or are otherwise uniquely arranged, as shown in FIG. 10C.

Figure 11A:
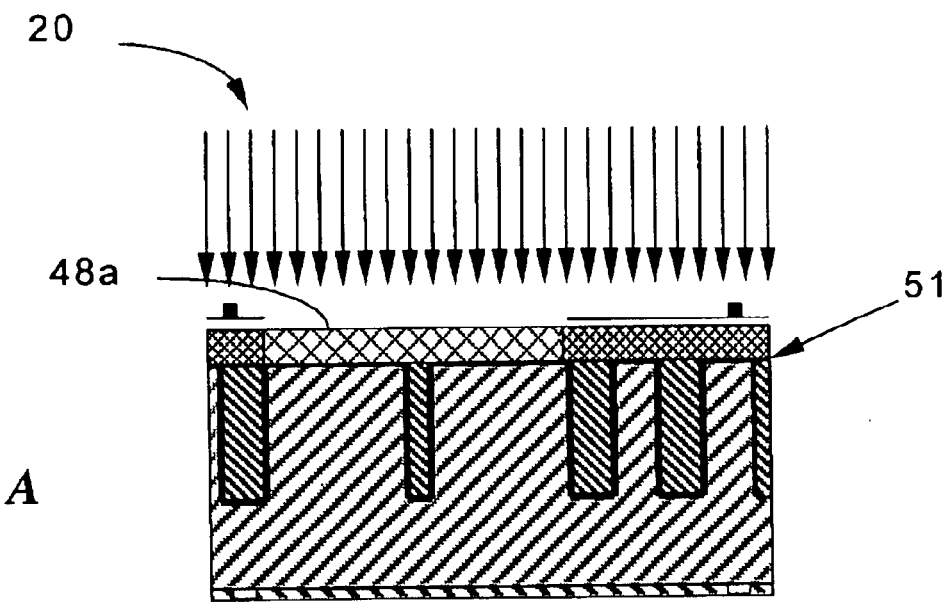
FIG. 11A shows the resist layer applied in FIG. 10B exposed to a source of broadband radiation to expose areas of the resist not covered by the contact mask.

In the case of embodiment 2, however, the positional tolerances of the second pattern vis-a-vis the first are far less critical since by carefully designing the pattern mask it is possible to avoid many of the critical alignment issues of the first embodiment. In particular, it is possible to prepare mask 50 such that it comprises "windows" roughly centered over the large open areas of the mask 48a which will form the desired mold structures in the PMMA substrate, regions that are intended to receive a lower x-ray dose such that once resist 48 is exposed and developed, as shown in FIG. 11A, x-ray moderating layer 52 may be deposited.

Figure 11B:
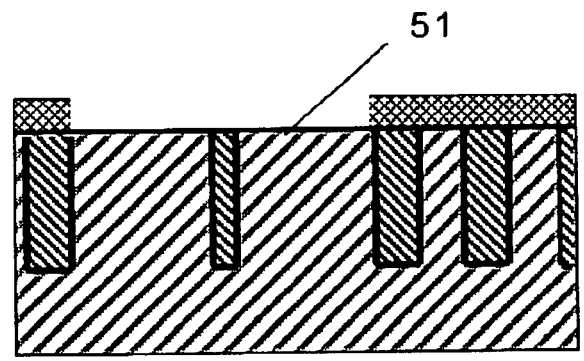
FIG. 11B illustrates the photoresist having been developed to remove those exposed portions of the resist.
Figure 11C:
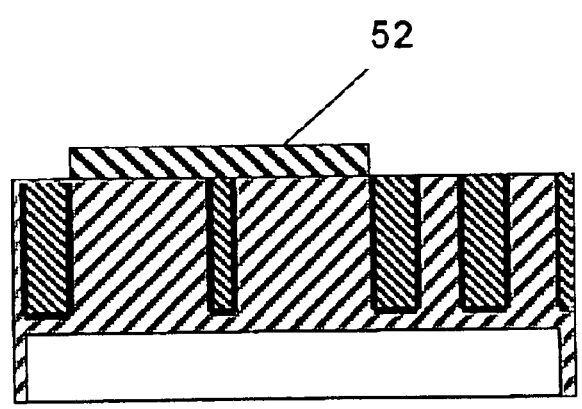
FIG. 11C illustrates the second x-ray attenuating layer deposited onto the silicon substrate in those areas not covered by the remaining photoresist such that portions of the first pattern are covered.

Once the exposed resist material 48a is removed a portion of metal layer 51 is exposed, as shown in FIG. 11B, and it is this exposed substrate onto which the final x-ray moderating layer 52, shown in FIG. 11C, is applied. Because layer 52 is designed to reduce, but not totally eliminate the x-ray flux transmitted through the layer, it will cover those larger areas of substrate surface 11 in which a reduced x-ray flux is desired while embedded layer 47a provides a barrier to stop transmitted x-rays altogether and, therefore, provide an effective "edge" for establishing feature detail. Furthermore, layer 51 does not significantly add to the absorption of x-ray flux due to its very thin cross section.

Thus when the patterned substrate is illuminated by x-ray radiation it will provide not only a sharp, positive image of the features to be replicated as mold recesses in PMMA but it will also provide for a means for reducing the PMMA development rate in those area where geometry factors favor such a reduction.

A final thinning step, illustrated in FIG. 11D, may be performed at this stage if the substrate has not been previously thinned. Again, thinning is intended to reduce the thickness of silicon substrate 10 across an area beneath the embedded metal pattern 47a since the thickness of the standard wafer is too thick to allow transmission of conventional x-ray fluxes. Thinning is performed on substrate surface 12, opposite pattern 47a, using a standard blanket etching technique until the thickness of silicon everywhere underneath pattern 47a is reduced to a thickness below about 100 microns which is consistent with the desired level of x-ray attenuation since the silicon substrate itself absorbs some portion of the beam. Etching is performed only in selective zones beneath pattern 47a in order to leave sufficient structural support for further processing the wafer.

As before, as similarly shown in FIG. 5, the operation of the variable dosing mask implemented as embodiment 2 is shown schematically in FIG. 12 and illustrates the attenuating effect in the incoming x-ray radiation Do by the stack layers of absorber material 47a, 51, and 52 providing attenuated x-ray fluxes $D_1 > D_2$.

Third Embodiment

A third and final embodiment follows essentially all of the steps of embodiment one, but instead of inverting the wafer and placing a second absorbing pattern layer on the second face of the wafer, the second pattern is placed over the first layer. The first layer provides a layer for a moderate reduction in transmitted x-ray flux and is used to underexposed regions of a mold in which slower development is desired. The second layer, in combination with the first, is intended to be nearly opaque to x-rays and is used to establish an inside edge of a feature and thus provide the desired overall size and shape of that feature rendered into the finished mold. These steps are described with reference to FIGS. 13 through 16.

In embodiment 3, therefore, each of the steps of embodiment 1 are duplicated up to the point at which the first image pattern is laid down. Instead of placing the x-ray limiting layers on opposite sides of the silicon wafer, as in embodiment 1, the present embodiment places these layers on the same side of the wafer substrate. As already noted, the first layer provides a substantially continuous x-ray attenuating layer which also contains a number of openings in which the image of a feature will be rendered which will have a large height-to-width aspect ratio and which will therefore require a higher relative x-ray dose in order that these features can be "developed" in a timely manner.

Once the first x-ray attenuating pattern has been created the second image forming pattern may be rendered over it. A thick layer of print-positive photoresist is applied over the first patterned layer and a second contact mask aligned with the witness marks applied to the opposite side of the substrate as before. The image described by the second contact mask is then rendered into the second photoresist layer using a high intensity source. The frequency of light used will depend upon the size of the smallest part (usually those which are to be exposed to the full x-ray dose) and the thickness of the resist layer. It is intended that the second resist layer be applied in a thick enough layer that the openings in the first x-ray attenuating layer do not impart a substantial edge effect at the surface of the second resist layer.

As described, in this configuration, is the second overlapping pattern which is used to establish the desired overall size and shape of the features rendered into the finished mold. By carefully designing the mask of the present invention such that those features known, as a consequence of their size and shape, to be difficult to develop in PMMA are located in zones over those open areas in the first layer, it is possible to obtain the benefits Referring now to FIG. 13A, the process begins with a silicon substrate or wafer 10. This substrate can, generally, have any useful shape and thickness but should of necessity be a thin wafer having parallel top and bottom surfaces 11 and 12. In particular the present invention is most easily implemented by using an industry standard 100 mm Ø×0.67 mm thick wafer. Once again, the thickness of a standard wafer is too great to allow transmission of standard fluxes of x-rays. However, because embodiment 3, like embodiment 2, applies the x-ray moderating layer only to one face of the substrate, the thinning step can be preformed as a final processing step. The FIGURES shown for this embodiment, therefore, are not necessarily intended to show only a cross section of wafer in an area thinned by the blanket etching process.

Figure 13A:
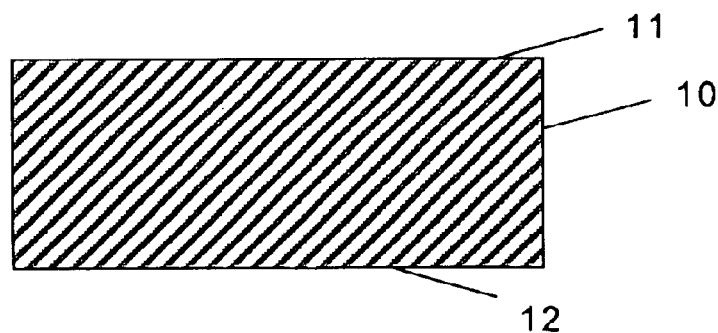
FIG. 13A shows a silicon substrate wafer.
Figure 13B:
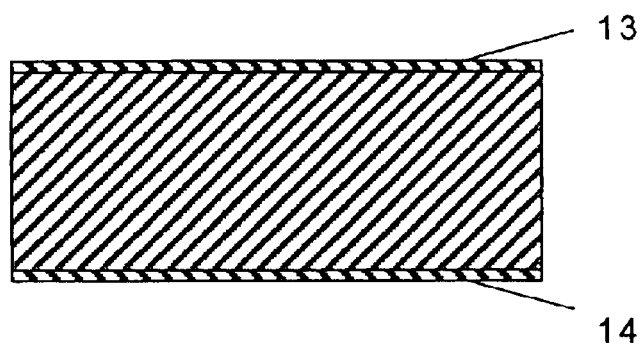
FIG. 13B illustrates the wafer of FIG. 13A having an initial adhesion layer deposited on the two surfaces of the wafer.

As before, the process begins with the two "faces," 13 and 14, of the substrate being "metallized", as illustrated in FIG. 13B, by depositing a first layer of chromium followed by a second layer of gold. By "faces" it is meant each of the two large, flat surfaces of the wafer or similar article. The first and second metallizing layers are quite thin—typically about one hundred to several hundred angstroms, respectively, and are used to provide a conductive deposition layer for subsequent processing. Metallization is performed by any known technique including but not limited to vapor phase deposition, particle deposition, or epitaxial deposition.

Figure 13C:
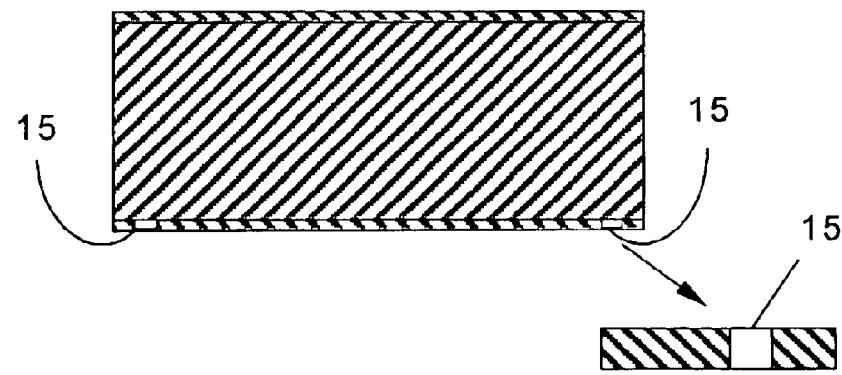
FIG. 13C shows witness marks written onto one of the two adhesion layers.

After metallizing the substrate several "witness" marks 15 are applied onto one of the two plated surfaces, as shown in FIG. 13C. This is done by using any conventional lithographic technique or by "writing" the pattern directly into the metallized coating by means of an electron beam or laser such that the metallized layer is removed. The marks are placed at several locations remote, possible peripheral, points on one "face" of the substrate. The witness marks will be used, subsequently, as alignment aids for establishing pattern registration between the substrate top and bottom faces.

Figure 13D:
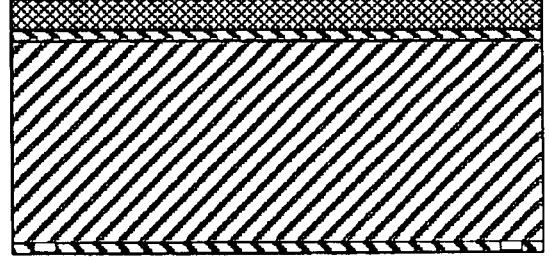
FIG. 13D shows the silicon substrate coated with a photoresist layer on the surface opposite the witness marks applied in FIG. 13C.

In FIG. 13D a liquid photoresist film 16' (herein Shipley 5740) comprises a print-positive resist and is applied by spin coating to a thickness of less than about 50 microns, preferably from about 5 to 20 microns, and then baked at a temperature of 110° C. for about 10 minutes in order to at least partially cure the resist layer. The particular resist thickness is chosen so as to provide a stencil form for a thick absorber layer while still providing for fully exposing the full thickness of the resist during the light exposure phase.

Figure 14A:
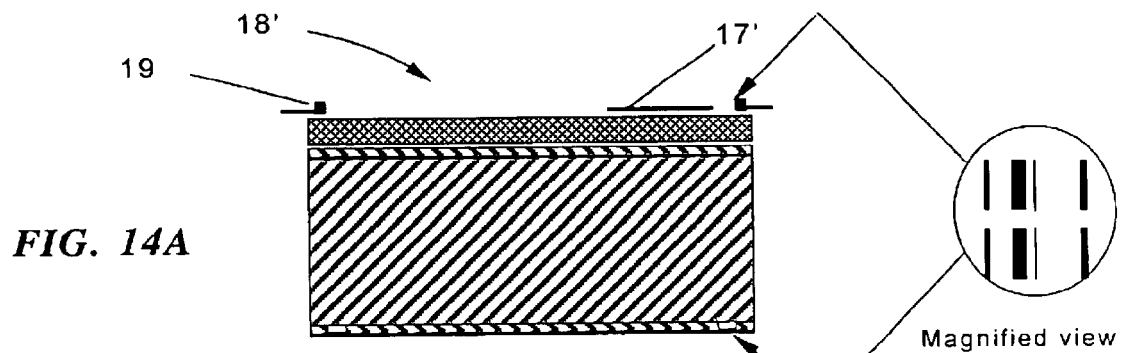
FIG. 14A illustrates a lithographic contact mask having a complementary set of witness marks to those of FIG. 13C, placed over the photoresist layer applied in FIG. 13D and aligned to bring the two sets of witness marks into coincidence.

In a next step, shown in FIG. 14A, a standard direct-contact lithographic mask 17' herein embodying a negative trace image of the desired pattern 18' is placed on the surface of the of resist layer 16'. Mask 17' is provided with corresponding witness marks 19 and aligned such that witness marks 19 on the mask and witness marks 15 the underside of the metallized substrate are brought into coincidence, as seen in FIG. 14A (mask 17' is shown above the surface of resist layer 16' for clarity sake only). This may be done by first fixing the position of the substrate and then moving the mask over the substrate by means of a standard x-y translatable stage driven by a pair of precision stepper motors (not shown). Mask 17' and substrate 10 are aligned by imaging the underside of the substrate metallized surface 14, with its witness marks 15, using conventional microscopy and camera optics and combining this image with an image of the corresponding set of witness marks 19 in contact mask 17'. By carefully adjusting the x-y stage the two sets of witness marks may be brought into coincidence or are otherwise uniquely arranged.

Figure 14B:
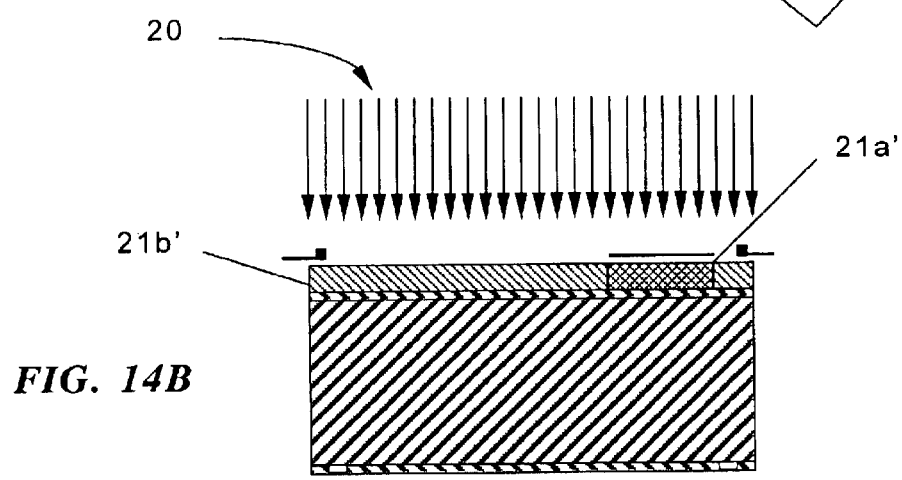
FIG. 14B illustrates the photoresist layer of FIG. 2A being exposed to a source of broadband radiation to expose areas of the photoresist not covered by the contact mask. The resist consists of an inverse chemistry wherein light exposure cross-links the resist material rendering it insoluble to materials used to remove the unexposed resist.

Once the mask and substrate are properly aligned, the portions of the resist layer 16' exposed by openings in mask 17' are subjected to a source (not shown) of broadband light, 20 herein shown in FIG. 14B. The exposure source used herein was a high pressure mercury-vapor lamp emitting light over a spectral range of about 365 nm to 450 nm and providing a dose of approximately 1000 millijoules/$cm_2$ measured at a wavelength of 365 nm.

Figure 14C:
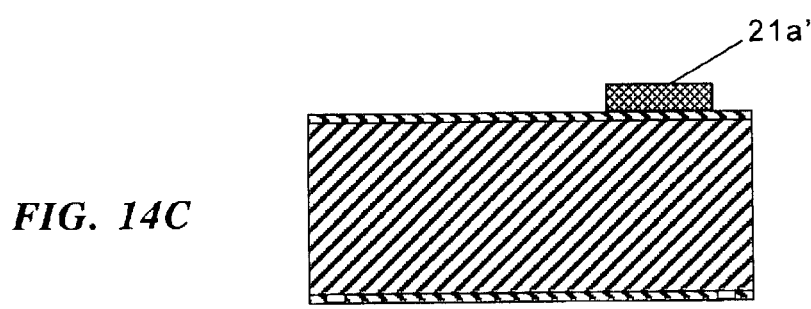
FIG. 14C illustrates the unexposed portions of the photoresist are removed leaving the exposed portions.

In the next step in the process, illustrated in FIG. 14C the photoresist is chemically "developed" and the unexposed portions, 21', of photoresist layer 16' are removed. What remains are the exposed portions, 21a', of the resist in an Inverse image of mask pattern 18' wherein this inverse image comprises "Clear" areas 21b' of substrate metallize surface 13. Again, this step is performed using standard and well-known lithographic processes.

Figure 14D:
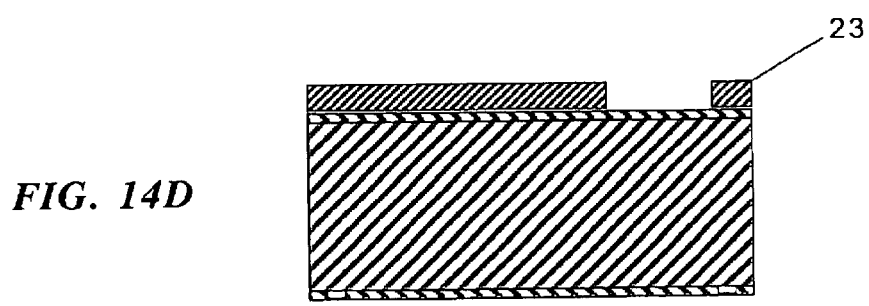
FIG. 14D illustrates the first x-ray attenuating layer deposited onto the silicon substrate in those areas not covered by the remaining photoresist after which the remaining resist is removed.

After cleaning and drying the developed mask, the entire surface of the mask is subsequently covered with thick metal film 23, as shown in FIG. 14D. The chosen process for applying the coating is typically a plating method although any other coating process which would provide a continuous layer would be equally effective. Such methods could include, but are not limited to, thermal evaporation or particle vapor deposition (PVD) process, chemical vapor deposition (CVD), sputtering and spraying coating methods. As disclosed herein, the film 23 is rendered in gold and is as thick as the resist layer. Any similar metal or combination of metals would be equally useful including most of the metals in the Transition series of metal listed in New IUPAC Group Numbers 4–12 of the Period Table of elements, alloys thereof, and certain of the metals of Groups 13 and 14, such as aluminum and tin providing that the thickness of the metal layer is adjusted to provide for attenuating radiation to a desired level. Following the final step of depositing the x-ray absorbing layer 23, the mask assembly is planarized and the remaining, exposed resist 21a' is removed.

Figure 15A:
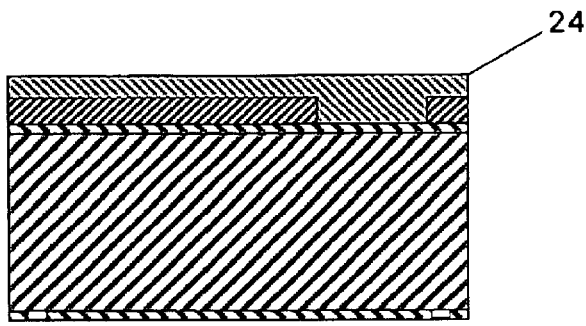
FIG. 15A shows the plated substrate having had the remaining resist material removed from the first surface and second photoresist layer is applied over the first attenuating layer. As before the resist has an inverse chemistry wherein light exposure cross-links the resist material rendering it insoluble to materials used to remove the unexposed resist.

The process is now repeated to apply the image forming layer onto the first x-ray moderating layer. In FIG. 15A a liquid photoresist film 24 (herein Shipley 5740) is applied by spin coating to a thickness of less than about 50 microns, preferably from about 5 to 15 microns, and then baked at a temperature of 110° C. for about 10 minutes in order to at least partially cure the resist layer.

The particular resist thickness is chosen so as to provide a stencil form for a thick absorber layer while still providing for fully exposing the full thickness of the resist during the light exposure phase.

Figure 15B:
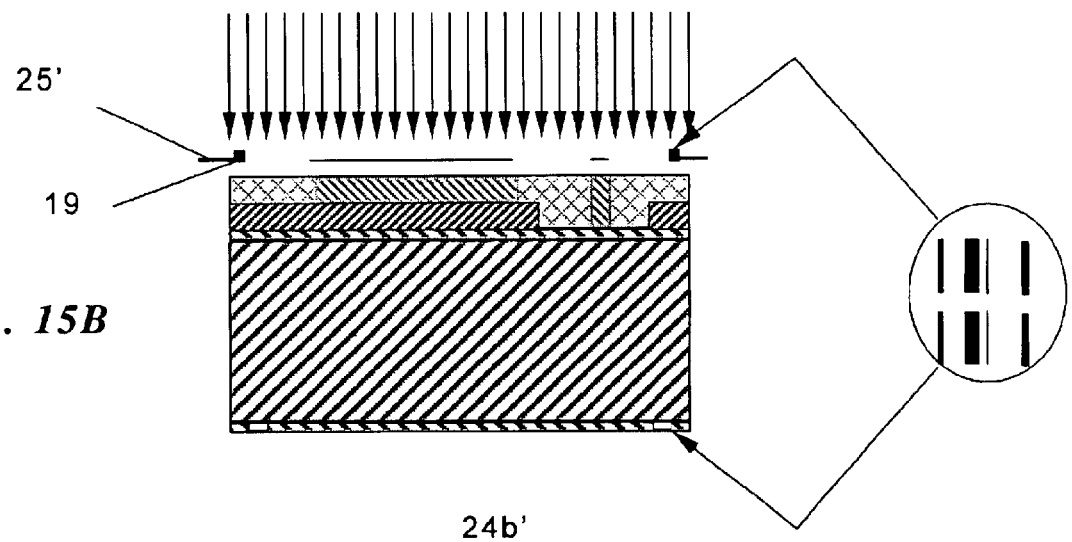
FIG. 15C shows the exposed portions of the resist not covered by the contact mask.
FIG. 15D shows the photoresist having been developed to remove those unexposed portions of the resist.

In a next step, shown in FIG. 15B, lithographic mask 25', embodying a negative trace image of the desired pattern 26', is placed on the surface of resist layer 24'. Mask 25' is provided with corresponding witness marks 19 and aligned such that witness marks 19 on the mask and witness marks 15 the underside of the metallized substrate are brought into coincidence, as seen in FIG. 15B. This may be done by first fixing the position of the substrate and then moving the mask over the substrate by means of a standard x-y translatable stage driven by a pair of precision stepper motors (not shown). Mask 25' and substrate 10 are aligned by imaging the underside of the substrate metallized surface 14, with its witness marks 15, using conventional microscopy and camera optics and combining this image with an image of the corresponding set of witness marks 19 in contact mask 25'. By carefully adjusting the x-y stage the two sets of witness marks may be brought into coincidence or are otherwise uniquely arranged.

Figure 15C:
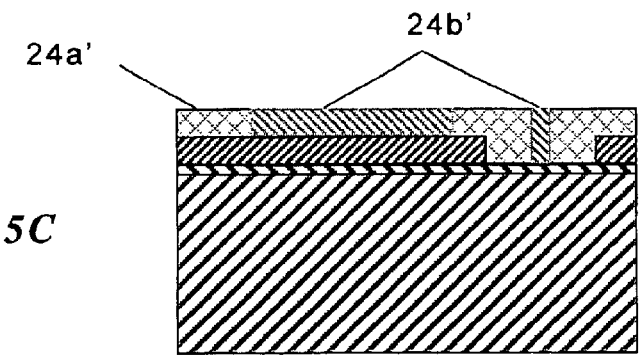

Once the mask and substrate are properly aligned, the portions of the resist layer 24' exposed by openings in mask 25' are subjected to a source (not shown) of broadband light, 20, herein shown in FIG. 15B. The exposure source used herein was a high pressure mercury-vapor lamp emitting light over a spectral range of about 365nm to 450 nm and providing a dose of approximately 1000 millijoules/$cm^2$ measured at a wavelength of 365 nm. FIG. 15C shows the areas 24a' of the resist that have been exposed to light source 20 and areas 24b' that have been covered by opaque areas of the mask.

Figure 15D:
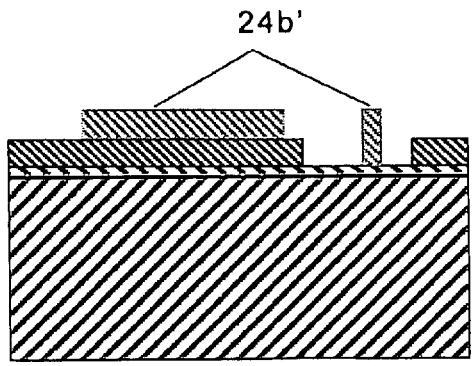

In the next step in the process, illustrated in FIG. 15D, the photoresist is chemically "developed" in order to remove exposed areas, 24a', of the resist layer. Unexposed portions 24b' remain, and are used as a blocking template to create zones within which deposition of a second metal absorber layer is prevented.

Figure 16A:
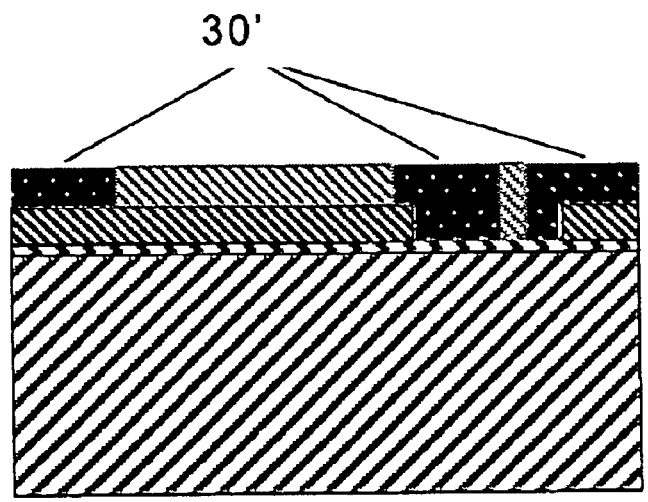
FIG. 16A illustrates the second x-ray attenuating layer deposited onto the silicon substrate in those areas not covered by the photoresist.

After cleaning and drying the developed mask, those portions of the mask surface which have been uncovered during the photoresist development process (open areas corresponding to removed resist portion 24a') are subsequently covered with thick metal film 30', as shown in FIG. 16A. The chosen process for applying the coating is typically a plating method although any other coating process which would provide a continuous layer would be equally effective. Such methods could include, but are not limited to, thermal evaporation or particle vapor deposition (PVD) process, chemical vapor deposition (CVD), sputtering and spraying coating methods. As disclosed herein, the film 30' is rendered in gold and is as thick as the resist layer. Any similar metal or combination of metals would be equally useful including most of the metals in the Transition series of metal listed in New IUPAC Group Numbers 4–12 of the Period Table of elements, alloys thereof, and certain of the metals of Groups 13 and 14, such as aluminum and tin providing that the thickness of the metal layer is adjusted to provide for attenuating radiation to a desired level. Following the final step of depositing the x-ray absorbing layer 30', the mask assembly is planarized and the remaining, exposed resist 24b' is removed.

Figure 16B:
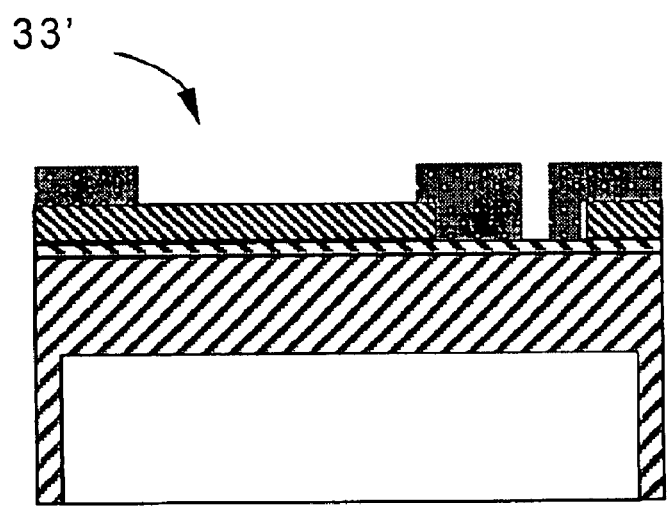
FIG. 16B shows the final configuration of a multilayer x-ray mask wherein the remaining portions of the second resist layer are removed and the region beneath the attenuating layers is removed by etching the silicon.
Figure 17:
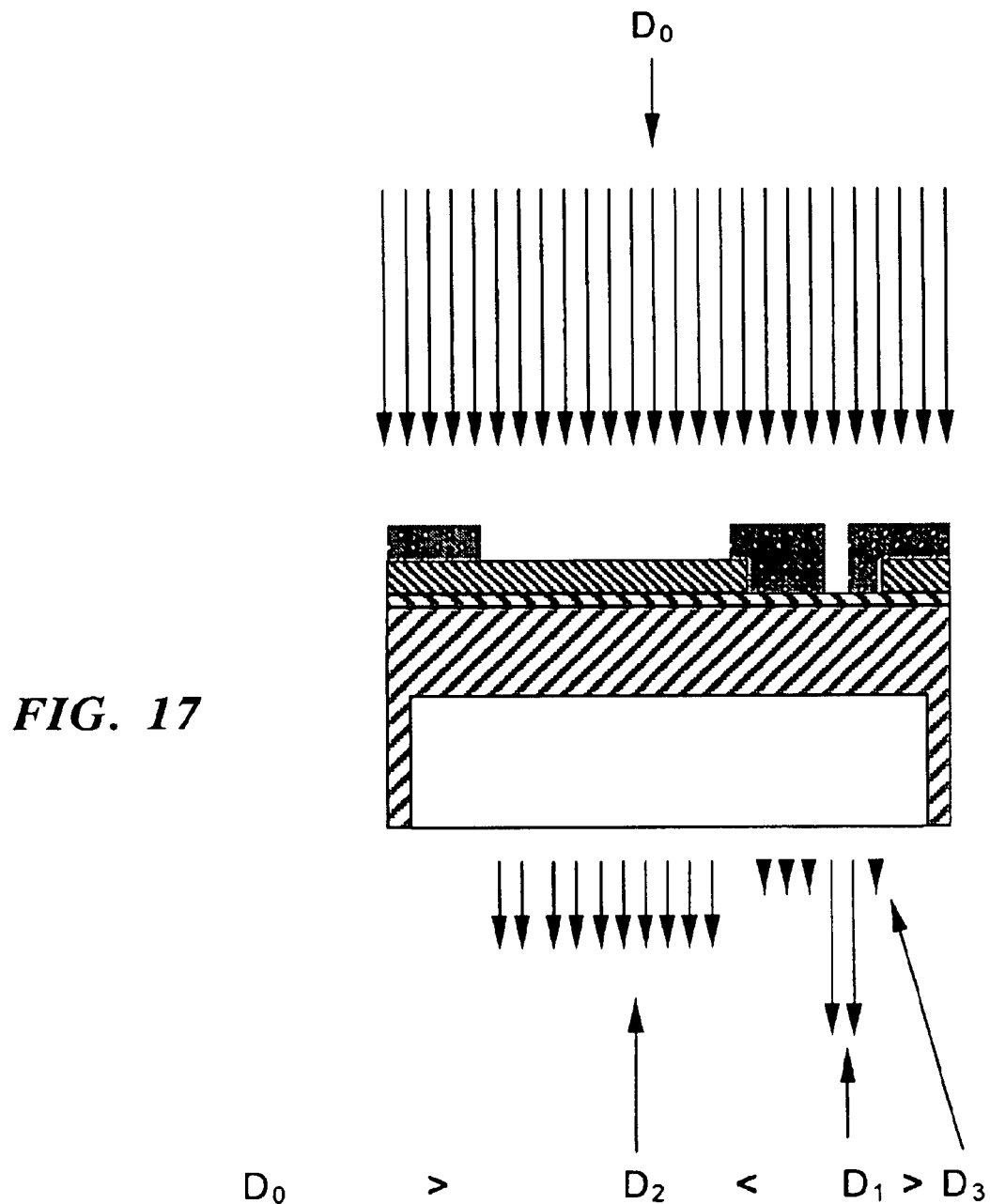
FIG. 17 illustrates the effect on a uniform flux of x-rays impinging the surface of the third embodiment of the mask at right angle, reducing the intensity of x-rays passing through various portions of the mask having one, two or no layers of attenuating material blocking the x-rays.
Figure 19A:
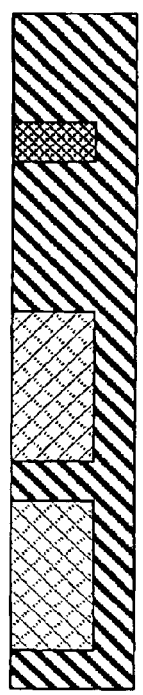
FIG. 19 illustrates the same cross-section of the PMMA mold of FIG. 1A which is developed such that only those areas which are not mass transport limited are fully developed, leaving those areas which are mass transport limited under-developed.
Figure 19B:
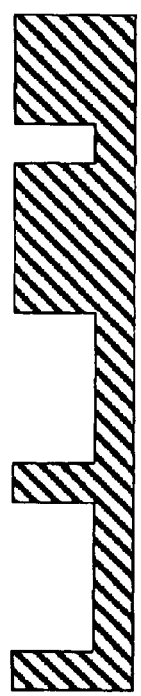
Figure 18A:
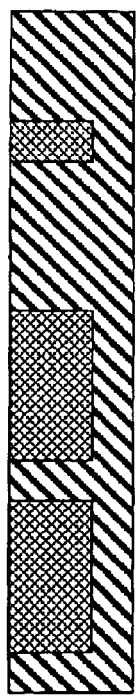
FIG. 18 shows a cross-section of a PMMA mold, exposed to a uniform dose of x-rays, which is developed such that all areas, including those areas which are mass transport restricted, are fully developed.
Figure 18B:
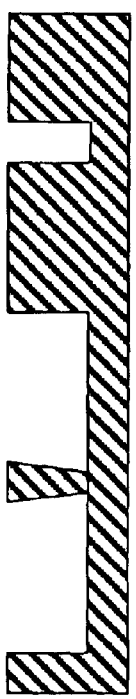
Figure 18C:

A final thinning step, illustrated In FIG. 16B, is intended to reduce the thickness of silicon substrate 10 across a region beneath the embedded metal pattern. As shown in FIG. 16B, thinning is performed on the back side 12 of wafer 10 using a standard blanket etching technique until the thickness of silicon beneath metal patterns 33' is reduced to a thickness which is consistent with the desired level of x-ray attenuation since the silicon substrate itself absorbs some portion of the beam, especially at wafer thicknesses above 100 microns. The operation of the third embodiment of the variable dosing mask is schematically illustrated, as before with embodiments 1 and 2, in FIG. 17 and illustrates the attenuating effect in the incoming x-ray radiation $D_0$ by the stack layers of absorber material 13, 23', and 30' providing attenuated x-ray fluxes $D_1 > D_2 > D_3$.

At this point, the x-ray mask is complete. By implementing these steps, a mask having x-ray attenuating structures which allow varying the x-ray exposure dose from point to point across the surface of the mask. The foregoing description of the invention has been presented for purposes of illustration and description and is not intended to be exhaustive or to limit the invention to the precise form disclosed. Many modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

What is claimed is:

1. An x-ray mask tool for providing regions of reduced x-ray flux transmission, comprising:
    a silicon substrate having a thickness and substantially parallel first and second surfaces;
    a first x-ray attenuating layer supported by said substrate and applied to said first surface, said first x-ray attenuating layer comprising a first image forming pattern comprising a plurality of openings, wherein each of said openings comprise an area; and
    a second x-ray attenuating layer supported by said substrate and applied to said second surface, said second x-ray attenuating layer comprising a second image forming pattern, wherein some or all of said second x-ray attenuating layer eclipses some or all of said first x-ray attenuating layer and some or all of said areas.

2. The x-ray mask tool of claim 1, wherein said first and second x-ray attenuating layers comprise a metal layer.

3. The x-ray mask tool of claim 2, wherein said metal layer is selected from the group consisting of the, Transition series of metals listed in New IUPAC Group Numbers 4–12 of the Period Table of elements, aluminum, tin, and alloys thereof.

4. The x-ray mask tool of claim 2, wherein said metal layer consists essentially of a layer of gold.

5. The x-ray mask tool of claim 2, wherein said metal layers have a thickness such that a source of x-ray radiation is attenuated in intensity from about 50% to about 100%.

6. The x-ray mask tool of claim 2, wherein said metal layer is applied by a deposition process.

7. The x-ray mask tool of claim 6, wherein said metal deposit is deposited by electroless deposition.

8. The x-ray mask tool of claim 6, wherein said metal is deposited by a process selected from the list consisting of thermal or particle vapor deposition, chemical vapor deposition, sputter deposition, molecular beam epitaxy.

9. The x-ray mask tool of claim 2, wherein said metal layer is applied by a plating process.

10. The x-ray mask tool of claim 9, wherein said metal deposit is deposited by electroplating.

11. An x-ray mask tool for providing regions of reduced x-ray flux transmission, comprising:
    a silicon substrate having a thickness and substantially parallel first and second surfaces:
    a first x-ray attenuating layer supported by said substrate and embedded into said substrate thickness, said first x-ray attenuating layer comprising a first image forming pattern comprising a plurality of openings, wherein each of said openings comprise an area, wherein said first image forming pattern is about flush with one of said first or second surface; and
    a second x-ray attenuating layer supported by said substrate and applied to either of said first or second surfaces, said second x-ray attenuating layer comprising a second image forming pattern, wherein some or all of said second x-ray attenuating layer eclipses some or all of said first x-ray attenuating layer and some or all of said areas.

* * * * *